United States Patent
Hagiwara et al.

(10) Patent No.: US 10,884,674 B2
(45) Date of Patent: Jan. 5, 2021

(54) SEMICONDUCTOR MEMORY DEVICE

(71) Applicant: TOSHIBA MEMORY CORPORATION, Tokyo (JP)

(72) Inventors: Yousuke Hagiwara, Kawasaki Kanagawa (JP); Kenta Shibasaki, Kamakura Kanagawa (JP); Yumi Takada, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/566,245

(22) Filed: Sep. 10, 2019

(65) Prior Publication Data

US 2020/0295742 A1    Sep. 17, 2020

(30) Foreign Application Priority Data

Mar. 15, 2019    (JP) .................................. 2019-049085

(51) Int. Cl.
*G06F 3/06* (2006.01)
*H03K 5/24* (2006.01)
*H03K 7/08* (2006.01)

(52) U.S. Cl.
CPC ......... *G06F 3/0679* (2013.01); *H03K 5/2472* (2013.01); *H03K 7/08* (2013.01)

(58) Field of Classification Search
CPC ....... G06F 3/0679; H03K 5/2472; H03K 7/08
USPC .......................................................... 327/77
See application file for complete search history.

(56) References Cited

U.S. PATENT DOCUMENTS

| 5,577,223 A * | 11/1996 | Tanoi ................. G11C 11/4087 711/118 |
| 6,115,285 A * | 9/2000 | Montanari .......... G11C 11/5621 365/185.03 |
| 2007/0274147 A1* | 11/2007 | Egerer ................. G11C 29/028 365/222 |
| 2010/0302835 A1* | 12/2010 | Mihnea .................... G11C 8/12 365/148 |
| 2012/0293346 A1 | 11/2012 | Takayama et al. |

FOREIGN PATENT DOCUMENTS

JP    2011193340 A    9/2011

* cited by examiner

*Primary Examiner* — William Hernandez
(74) *Attorney, Agent, or Firm* — Holtz, Holtz & Volek PC

(57) ABSTRACT

According to one embodiment, a semiconductor memory device includes a memory cell array, first to third circuits. The first circuit is configured to control duty cycles of first and second signals based on a third signal, and output fourth and fifth signals. The second circuit is configured to acquire information regarding duty cycles. The third circuit is configured to control the third signal. The second circuit includes a switching circuit and a comparator. The switching circuit is configured to transfer the fourth and fifth signals to first and second nodes. The comparator is configured to compare a signal voltages in the first and second nodes, and output the comparison result to the third circuit.

20 Claims, 28 Drawing Sheets

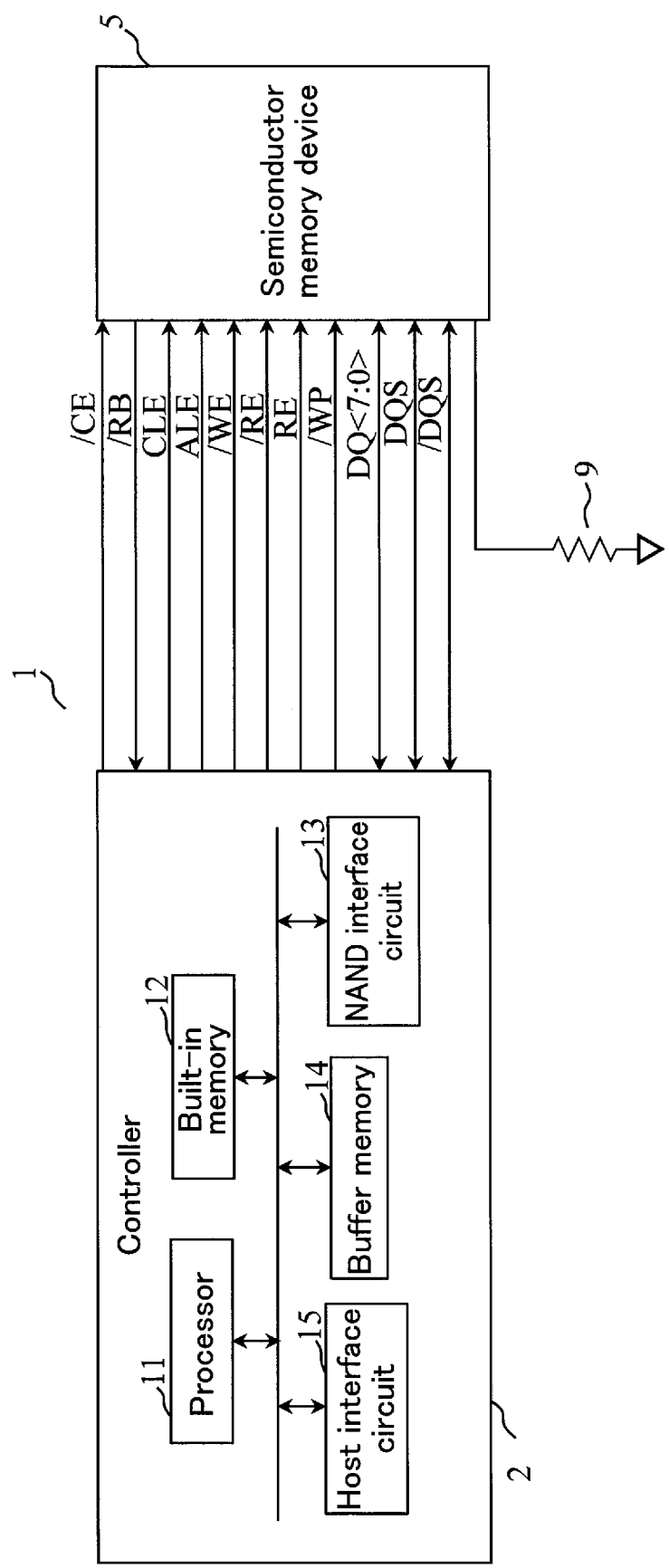
F I G. 1

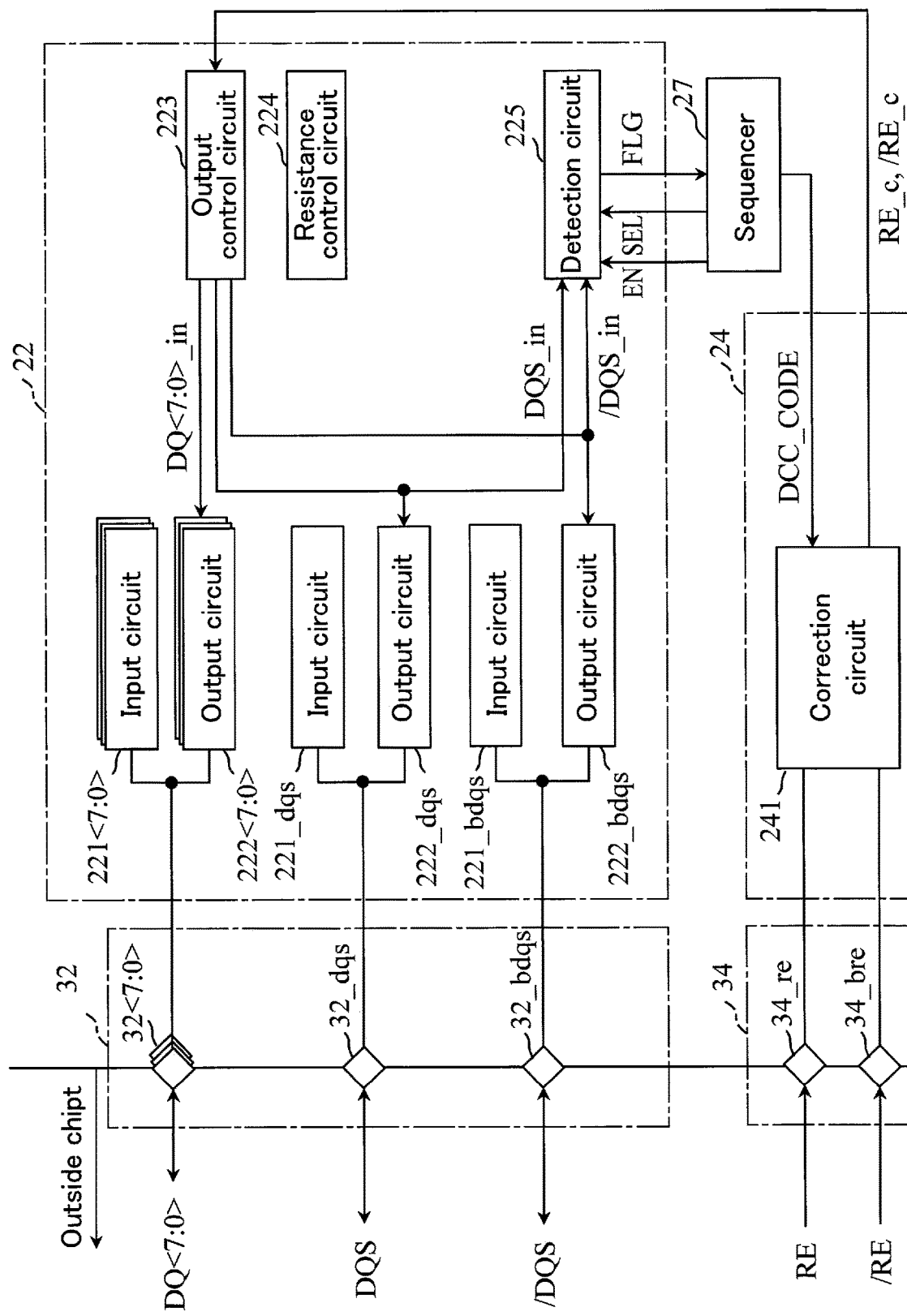
F I G. 3

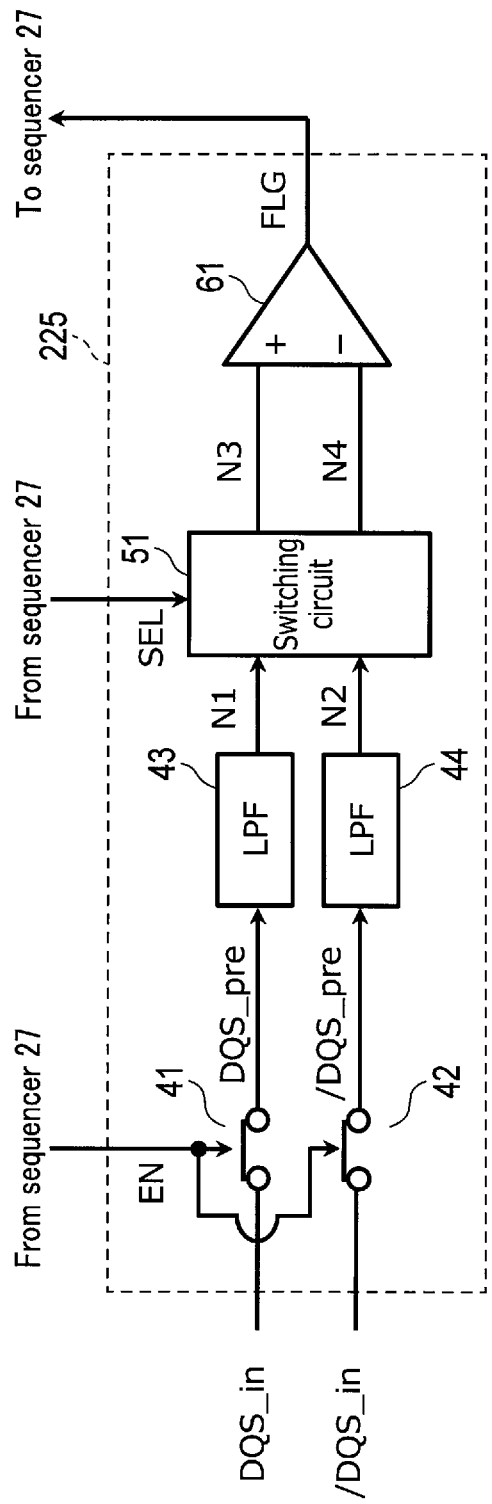
F I G. 4

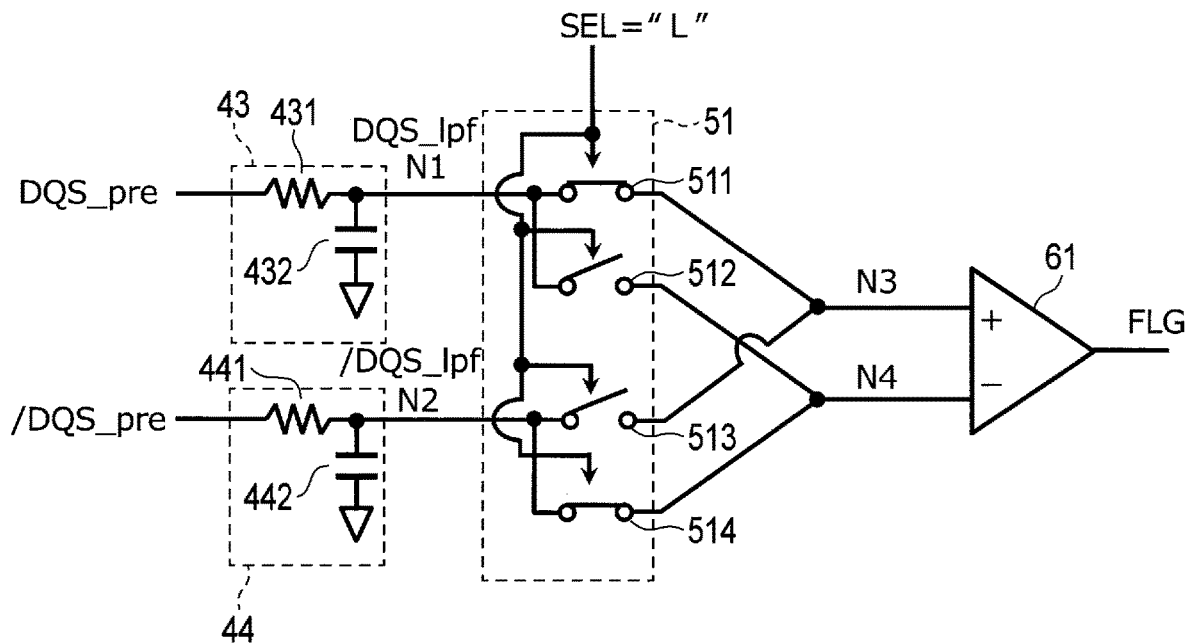
F I G. 5
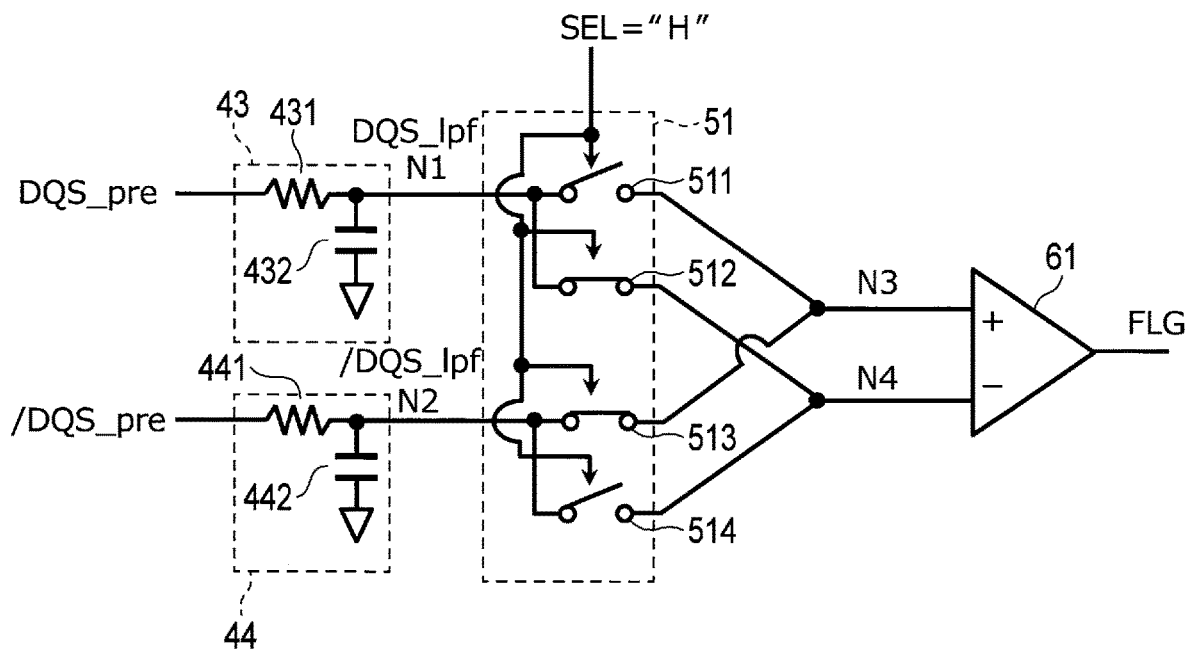
F I G. 6

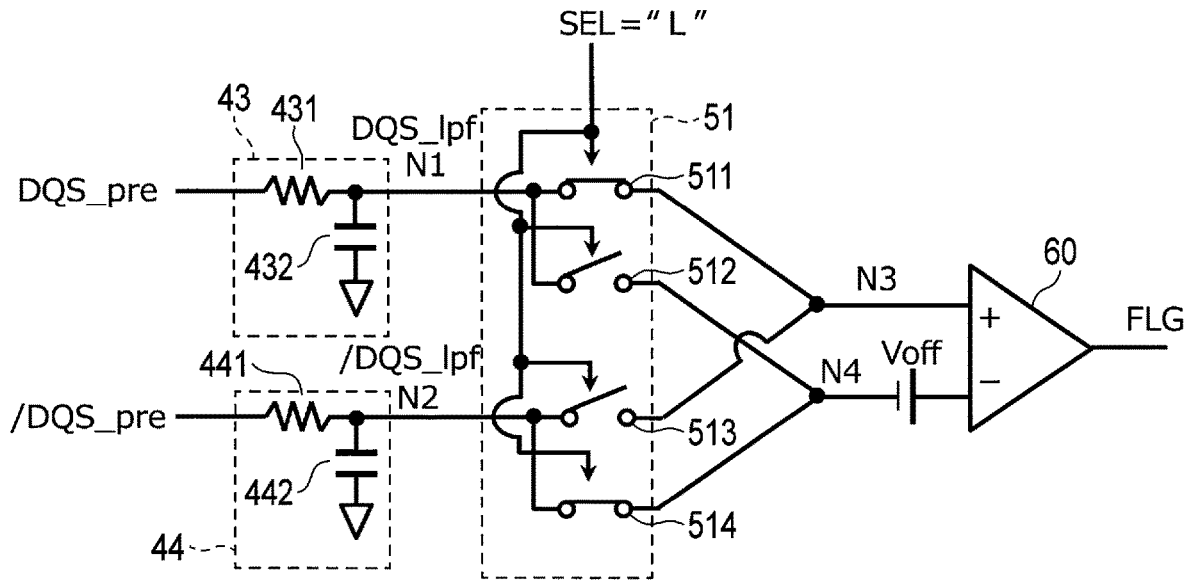
F I G. 9
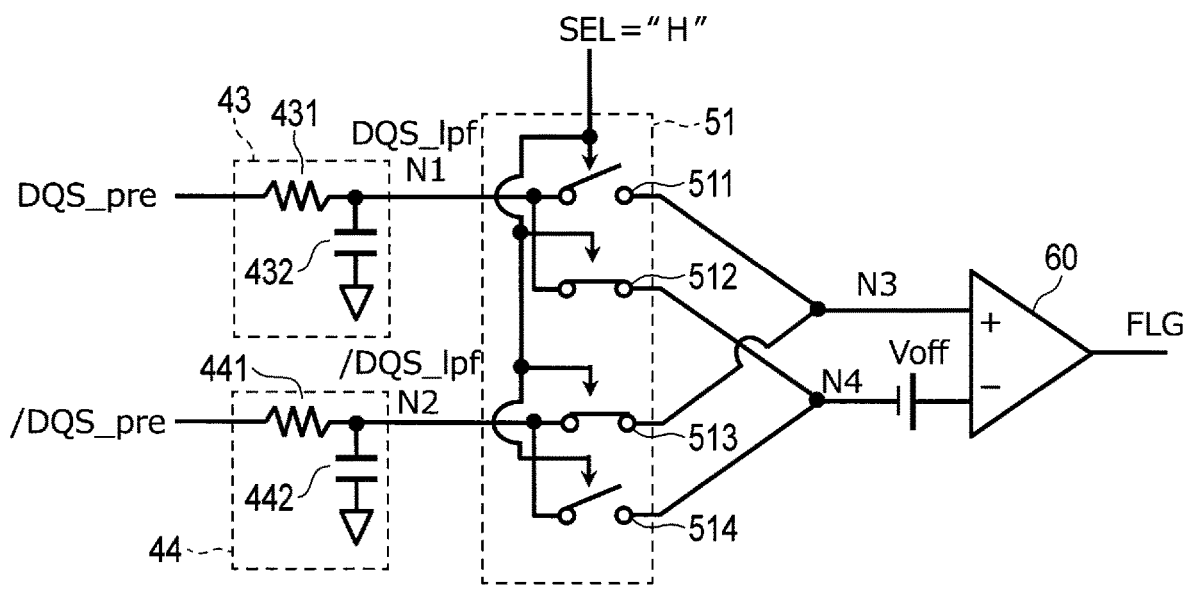
F I G. 10

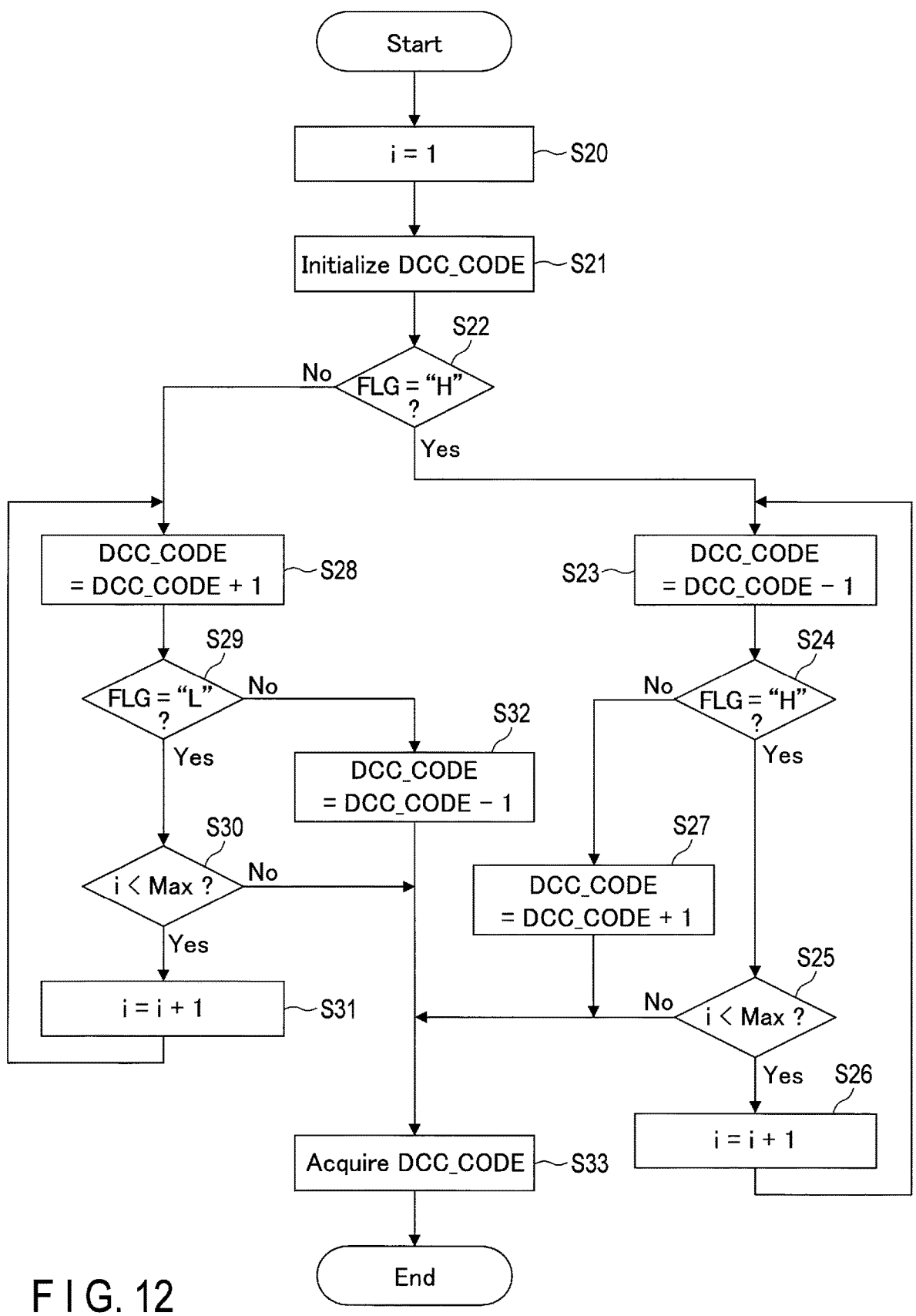
F I G. 12

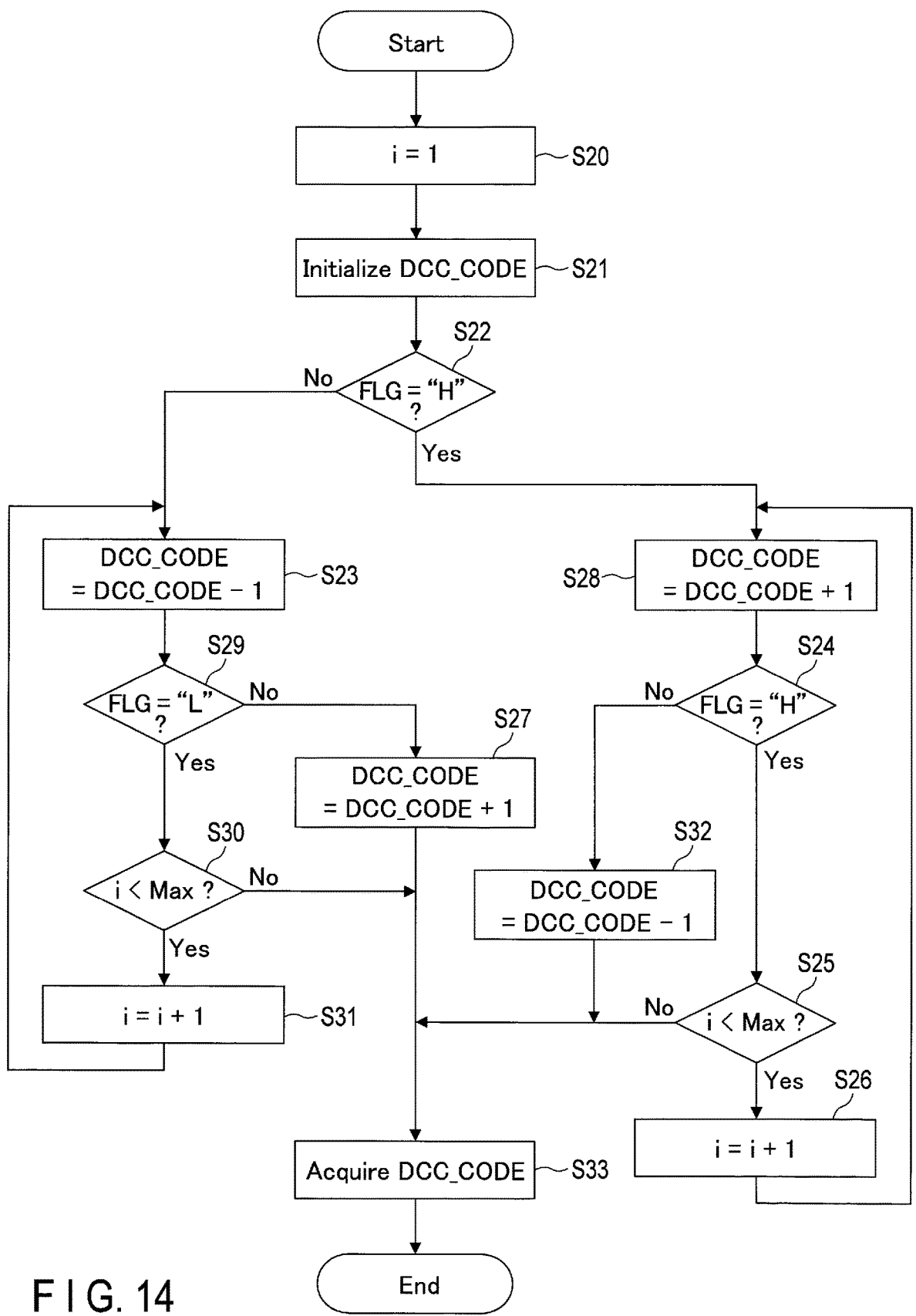
F I G. 14

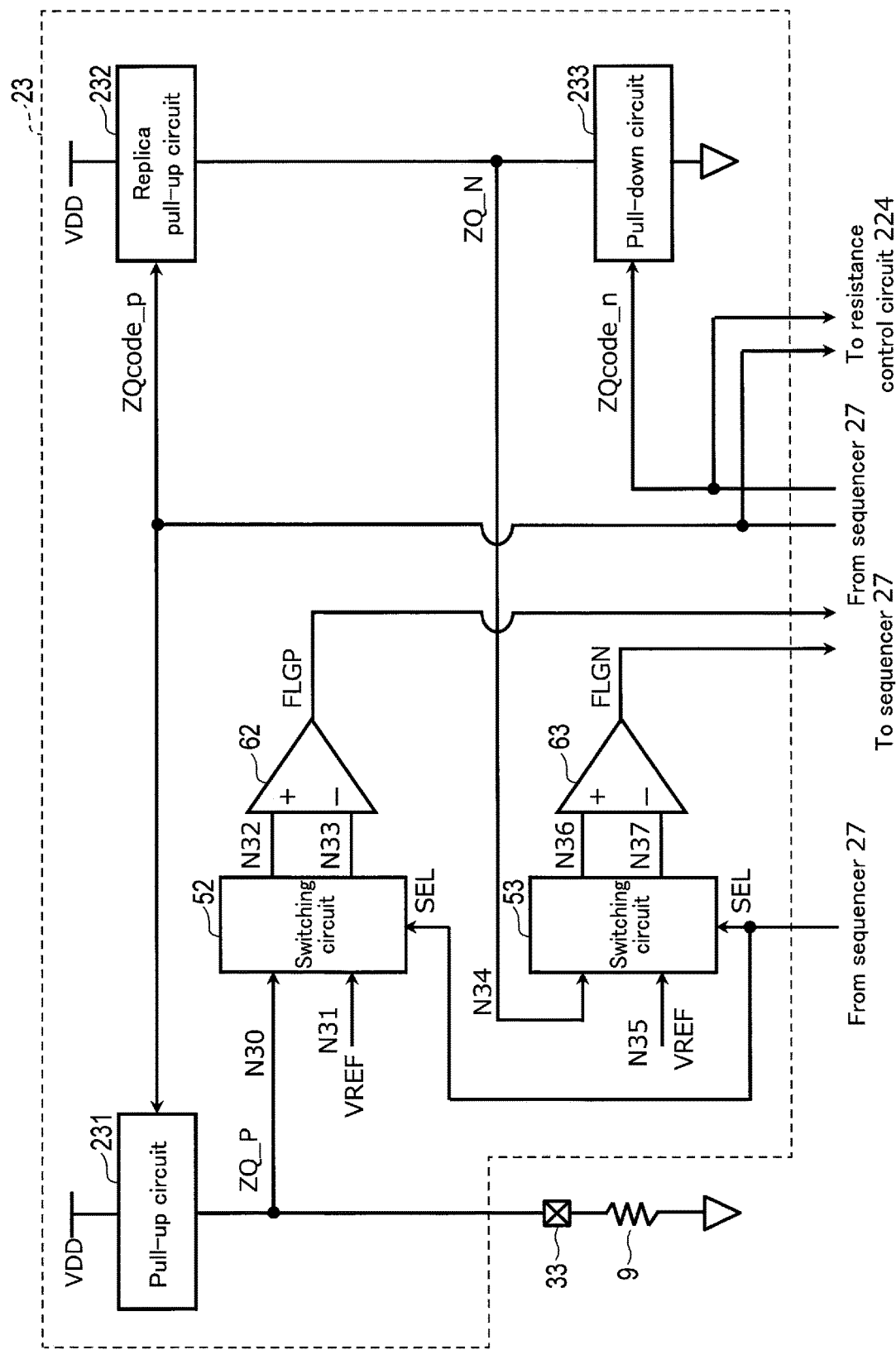
F I G. 18

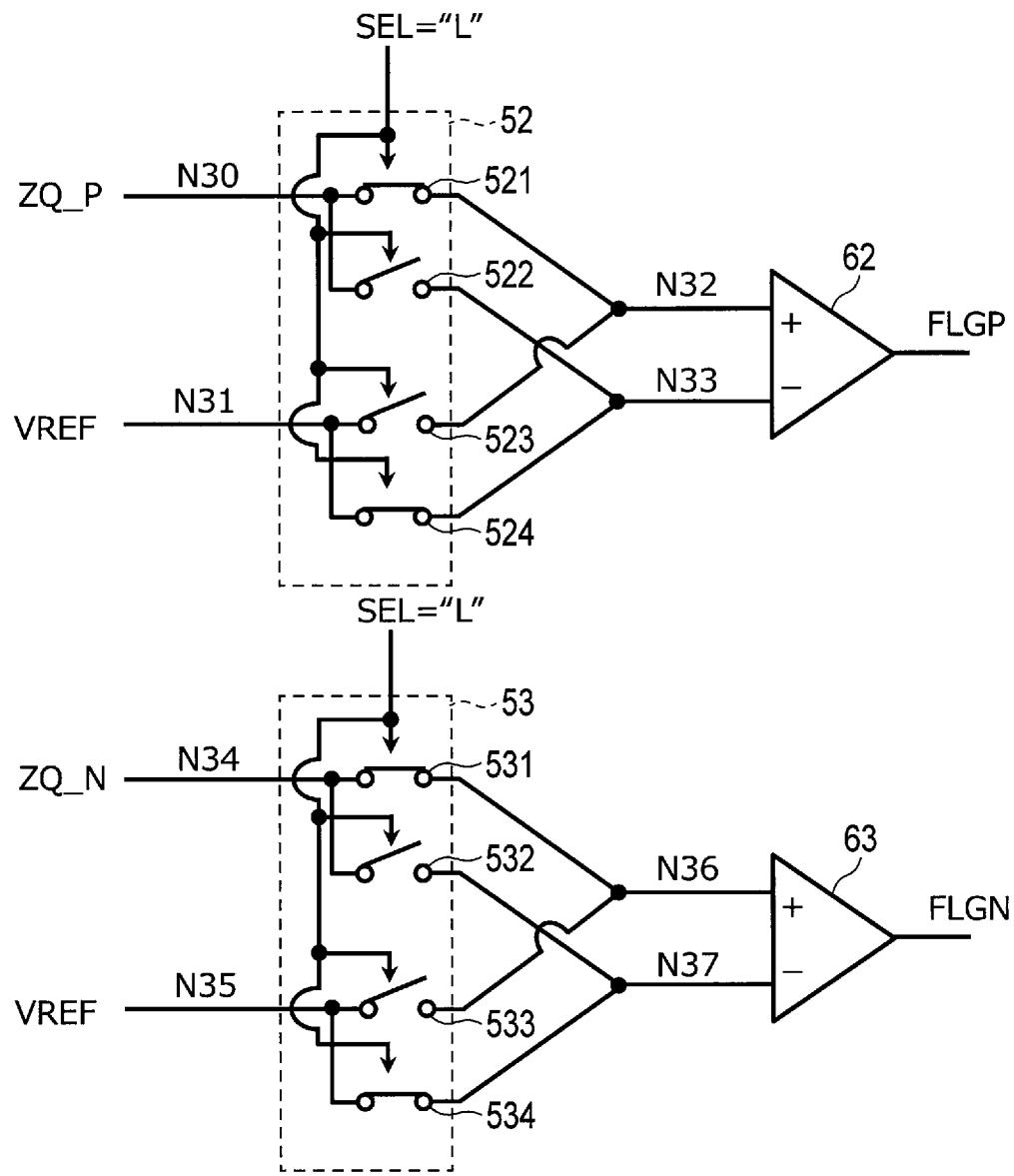
F I G. 19

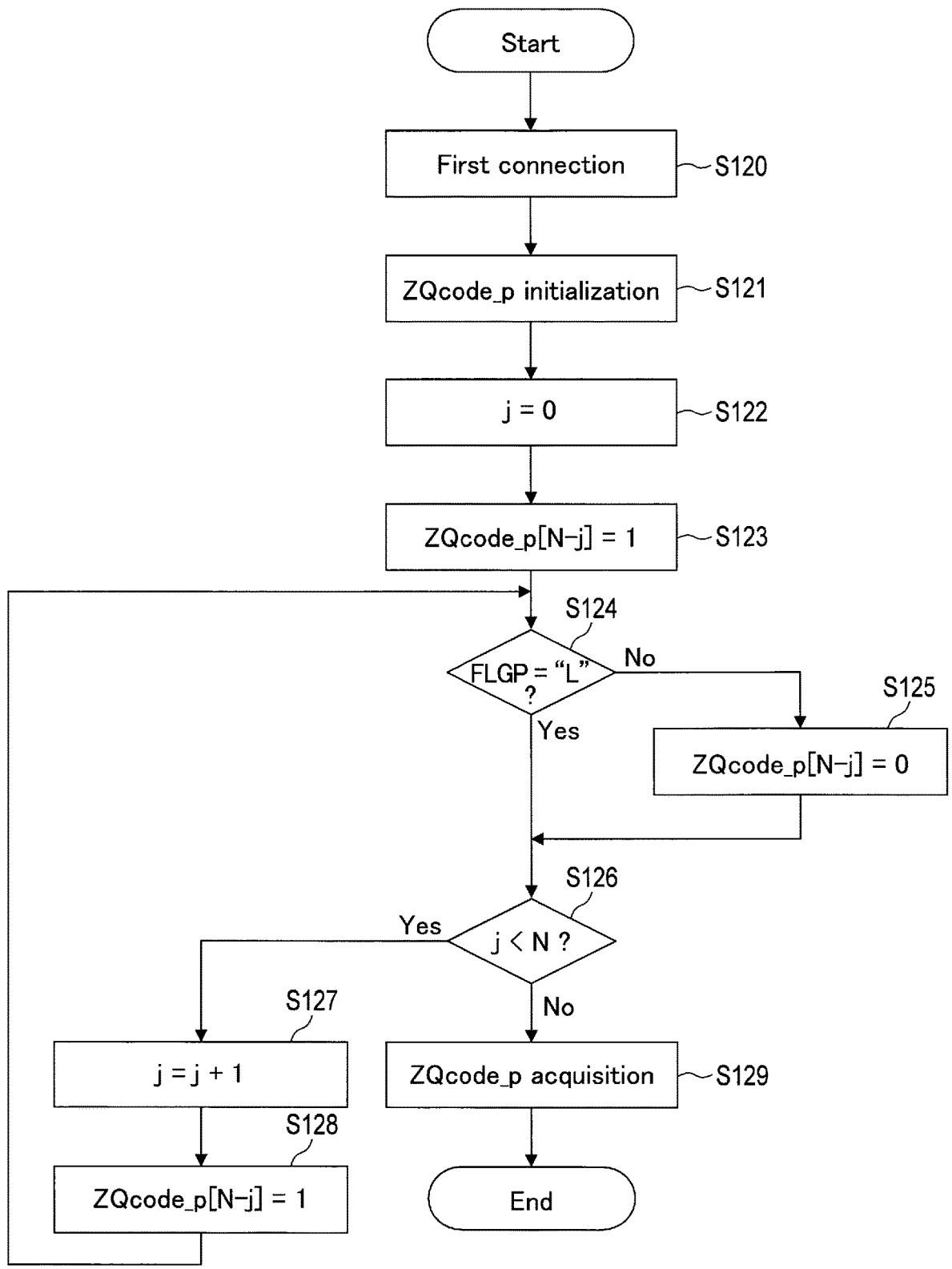
F I G. 23

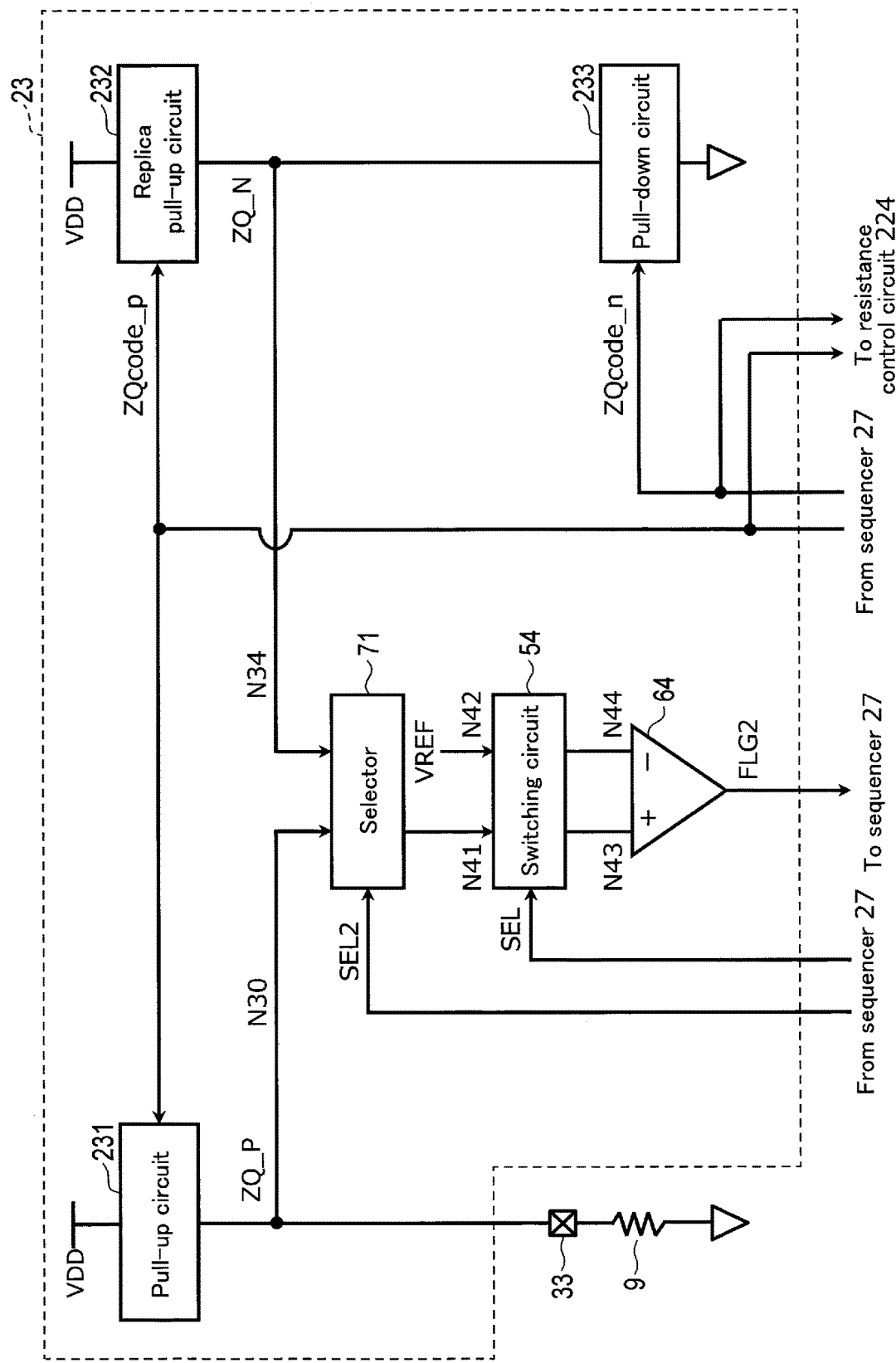
F I G. 30

SEMICONDUCTOR MEMORY DEVICE

CROSS-REFERENCE TO RELATED APPLICATIONS

This application is based upon and claims the benefit of priority from Japanese Patent Application No. 2019-049085, filed Mar. 15, 2019, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 1 is a block diagram showing a configuration example of a memory system according to a first embodiment.

FIG. 3 is a block diagram showing a part of the configuration example of the semiconductor memory device according to the first embodiment.

FIG. 4 is a block diagram showing a configuration example of a detection circuit provided in the semiconductor memory device according to the first embodiment.

FIG. 5 is a circuit diagram showing an example of a circuit included in the detection circuit provided in the semiconductor memory device according to the first embodiment.

FIG. 6 is a circuit diagram showing an example of a circuit included in the detection circuit provided in the semiconductor memory device according to the first embodiment.

FIG. 9 is an equivalent circuit diagram showing a contribution of an input offset to a circuit included in the detection circuit provided in the semiconductor memory device according to the first embodiment.

FIG. 10 is an equivalent circuit diagram showing a contribution of an input offset to a circuit included in the detection circuit provided in the semiconductor memory device according to the first embodiment.

FIG. 12 is a flowchart showing an example of a duty cycle correction operation in a semiconductor memory device according to a second embodiment.

FIG. 14 is a flowchart showing an example of the duty cycle correction operation in the semiconductor memory device according to the second embodiment.

FIG. 18 is a block diagram showing a configuration example of a ZQ calibration circuit provided in a semiconductor memory device according to a fourth embodiment.

FIG. 19 is a circuit diagram showing an example of a circuit included in the ZQ calibration circuit provided in the semiconductor memory device according to the fourth embodiment.

FIG. 23 is a flowchart showing an example of an operation of a ZQ calibration circuit provided in a semiconductor memory device according to a fifth embodiment.

FIG. 30 is a block diagram showing a modified example of the ZQ calibration circuit provided in the semiconductor memory device according to the fourth embodiment.

DETAILED DESCRIPTION

Figure 2:
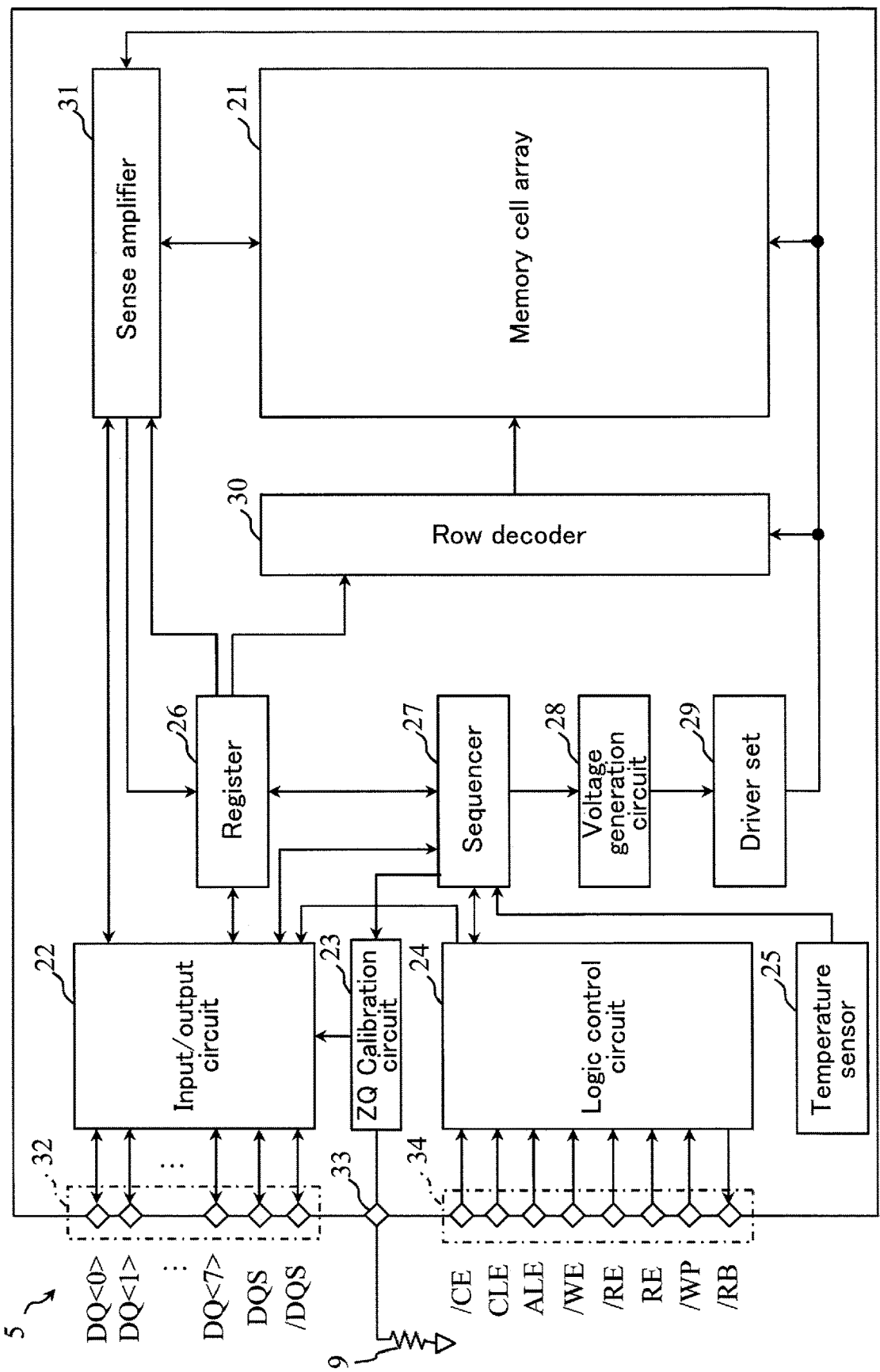
FIG. 2 is a block diagram showing a configuration example of a semiconductor memory device according to the first embodiment.

In general, according to one embodiment, semiconductor memory device includes a memory cell array, a first circuit, a second circuit, and a third circuit. The memory cell array is configured to hold data. The first circuit is configured to receive a first signal and a second signal from an external device, control duty cycles of the first signal and the second signal based on a third signal, and output a fourth signal and a fifth signal to the external device, when outputting data read from the memory cell array to the external device. The second circuit is configured to acquire information regarding duty cycles of the fourth signal and the fifth signal. The third circuit is configured to control the third signal based on the information acquired by the second circuit. The second circuit includes a switching circuit and a comparator. The switching circuit is configured to transfer the fourth signal to a first node, and the fifth signal to a second node, or transfer the fourth signal to the second node, and the fifth signal to the first node based on a sixth signal. The comparator is configured to compare a signal voltage in the first node and a signal voltage in the second node, and output the comparison result to the third circuit as the information.

Hereinafter, embodiments will be described with reference to the accompanying drawings. In the following description, structural elements having substantially the same functions and configurations will be denoted by the same reference symbols, and repetitive explanations thereof will be omitted. Furthermore, all of the descriptions regarding a certain embodiment will apply as descriptions of another embodiment unless they are explicitly or obviously excluded.

Each function block does not necessarily have to be categorized in the manner of the following example. For example, some functions may be implemented by a function block other than the exemplary function blocks. In addition, the exemplary function blocks may be further divided into detailed function sub-blocks. The embodiments are not limited by the function blocks specified.

In the specification and claims of the present application, when a certain first element is "connected" to another second element, the first element may be connected to the second element directly, or via an element that is always or that becomes selectively conductive.

In the following explanation, signal X <n:0> (n is a natural number) is a signal of (n+1) bits, and indicates a group of signals X <0>, X <1>, . . . , and X <n>, each of which is a signal of one bit. Furthermore, structural element Y <n:0> indicates a group of structural elements Y <0>, Y <1>, . . . , and Y <n> that corresponds one-on-one to an input or an output of signal X <n:0>.

Furthermore, in the following explanation, signal /Z indicates that it is an inversion signal of signal Z. Furthermore, a "duty cycle of signal Z" indicates a ratio of time from when a pulse rises until the pulse falls with respect to one cycle of the pulse in signal Z.

1. First Embodiment

A memory system according to a first embodiment will be explained. The memory system according to the first embodiment includes, for example, a NAND-type flash memory as a semiconductor memory device, and a memory controller to control the NAND-type flash memory.

1.1. Configuration 1.1.1. Entire Configuration of Memory System

An entire configuration of the memory system according to the first embodiment will be explained with reference to FIG. 1. A memory system 1, for example, communicates with external host equipment (not shown). The memory system 1 holds data from the host equipment, and reads data on the host equipment.

FIG. 1 is a block diagram showing an example of an entire configuration of the memory system according to the first embodiment. As shown in FIG. 1, the memory system 1 comprises a controller 2, a semiconductor memory device 5, and a reference resistor 9. As shown in FIG. 1, the controller 2 controls the semiconductor memory device 5. Specifically, the controller 2 writes data to the semiconductor memory device 5, and reads data from the semiconductor memory device 5. The controller 2 is connected to the semiconductor memory device 5 by a NAND bus.

The semiconductor memory device 5 comprises a plurality of memory cells, and stores data in a non-volatile manner.

The NAND bus includes a plurality of signal lines, and transmits/receives signals /CE, CLE, ALE, /WE, RE, /RE, /WP, /RB, DQ <7:0>, DQS, and /DQS in accordance with a NAND interface. Signals ICE, CLE, ALE, /WE, RE, /RE, and /WP are transmitted from the controller 2 and received by the semiconductor memory device 5. Signal /RB is transmitted from the semiconductor memory device 5 and received by the controller 2.

Signal /CE is a signal for enabling the semiconductor memory device 5. Signal CLE notifies the semiconductor memory device 5 that signals DQ <7:0> flowing to the semiconductor memory device 5 while signal CLE is an "H (High)" level are commands. Signal ALE notifies the semiconductor memory device 5 that signals DQ <7:0> flowing to the semiconductor memory device 5 while signal ALE is an "H (High)" level are addresses. Signal /WE instructs the semiconductor memory device 5 to import signals DQ <7:0> flowing to the semiconductor memory device 5 while signal /WE is an "L (Low)" level. Signals RE and /RE instruct the semiconductor memory device 5 to output signals DQ <7:0>, and, for example, are used to control an operation timing of the semiconductor memory device 5 when outputting signals DQ <7:0>. Signal /WP instructs the semiconductor memory device 5 to prohibit data writing and erasing. Signal /RB indicates whether the semiconductor memory device 5 is in a ready state (a state in which a command from an external device can be received) or is in a busy state (a state in which a command from an external device cannot be received). Signals DQ <7:0> are, for example, 8-bit signals. Signals DQ <7:0> are entities of data transmitted/received between the semiconductor memory device 5 and the controller 2, and include commands, addresses, and data. Signals DQS and /DQS can be generated based on, for example, signals RE and /RE, and are used to control an operation timing of the semiconductor memory device 5 according to signals DQ <7:0>.

1.1.2. Configuration of Controller

The controller of the memory system according to the first embodiment will be continuously explained with reference to FIG. 1. The controller 2 comprises a processor (Central Processing Unit (CPU)) 11, a built-in memory (Random Access Memory (RAM)) 12, a NAND interface circuit 13, a buffer memory 14, and a host interface circuit 15.

The processor 11 controls the entire operation of the controller 2. The processor 11 issues a write command based on the NAND interface to the semiconductor memory device 5 in response to, for example, a data write command received from an external device. This operation is also the same in the case of other operations such as reading and erasing data, the duty cycle correction operation of a signal, and the calibration operation of an output impedance.

The built-in memory 12 is a semiconductor memory, such as a Dynamic RAM (DRAM), and is used as a work area of the processor 11. The built-in memory 12 holds firmware and various management tables, etc., for managing the semiconductor memory device 5.

The NAND interface circuit 13 is connected to the semiconductor memory device 5 via the above-mentioned NAND bus, and controls communication with the semiconductor memory device 5. By the instruction of the processor 11, the NAND interface circuit 13 transmits a command, an address, and write data to the semiconductor memory device 5. Furthermore, the NAND interface circuit 13 receives a status and read data from the semiconductor memory device 5.

The buffer memory 14 temporarily holds data, etc. received by the controller 2 from the semiconductor memory device 5 and an external device (host equipment).

The host interface circuit 15 is connected to the external host equipment (not shown) and controls communications with the host equipment. The host interface circuit 15 transfers, for example, commands and data received from the host equipment respectively to the processor 11 and the buffer memory 14.

1.1.3. Configuration of Semiconductor Memory Device

A configuration example of the semiconductor memory device according to the first embodiment will now be explained with reference to FIG. 2. As shown in FIG. 2, the semiconductor memory device 5 comprises a memory cell array 21, an input/output circuit 22, a ZQ calibration circuit 23, a logic control circuit 24, a temperature sensor 25, a register 26, a sequencer 27, a voltage generation circuit 28, a driver set 29, a row decoder 30, a sense amplifier 31, an input/output pad group 32, a ZQ calibration pad 33, and a logic control pad group 34.

The memory cell array 21 includes a plurality of non-volatile memory cells (not shown) associated with word lines and bit lines.

The input/output circuit 22 transmits/receives signals DQ <7:0>, DQS, and /DQS to/from the controller 2. The input/output circuit 22 transfers the commands and the addresses within the signals DQ <7:0> to the register 26. The input/output circuit 22 transmits/receives the write data and the read data to/from the sense amplifier 31. Furthermore, the input/output circuit 22 generates signals DQS and /DQS based on signals RE and /RE described later.

The ZQ calibration circuit 23 calibrates an output impedance of the semiconductor memory device 5 based on the reference resistor 9 via the ZQ calibration pad 33.

The logic control circuit 24 receives signals /CE, CLE, ALE, /WE, RE, /RE, and /WP from the controller 2. Furthermore, the logic control circuit 24 transfers signal /RB to the controller 2, and notifies the state of the semiconductor memory device 5 to an external device. The logic control circuit 24 also corrects the duty ratio of signals RE and /RE.

The temperature sensor 25 has a function capable of measuring the temperature inside the semiconductor memory device 5. The temperature sensor 25 transmits information regarding the measured temperature to the sequencer 27. Furthermore, although the temperature sensor 25 can be provided at any place inside the semiconductor memory device 5, it is preferably provided in an area where, for example, a temperature considered to be that of the memory cell array 21 can be measured.

The resistor 26 holds commands and addresses. The resistor 26 transfers the address to the row decoder 30 and the sense amplifier 31, and transfers the command to the sequencer 27.

The sequencer 27 receives the command and controls the entire semiconductor memory device 5 in accordance with the sequence based on the received command. Furthermore, the sequencer 27 transmits the information regarding the temperature received from the temperature sensor 25 to the controller 2 via the input/output circuit 22. The sequencer 27 also controls the input/output circuit 22 and the logic control circuit 24 so that the duty cycle of signals DQS and /DQS becomes approximately 50%.

The voltage generation circuit 28 generates a voltage necessary for the operations of such as writing, reading, and erasing data, based on the instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the address from the resistor 26. The driver set 29 supplies various voltages to the row decoder 30 based on, for example, a row address in the address.

The row decoder 30 receives the row address in the address from the resistor 26 and selects a memory cell of a row based on the row address. To the memory cell of the selected row, a voltage from the driver set 29 is transferred via the row decoder 30.

When reading the data, the sense amplifier 31 senses the read data read from the memory cell to the bit line, and transfers the sensed read data to the input/output circuit 22. When writing the data, the sense amplifier 31 transfers the write data to be written to the memory cell via the bit line. Furthermore, the sense amplifier 31 receives a column address in the address from the resistor 26 and outputs data of a column that is based on the column address.

The input/output pad group 32 transfers signals DQ <7:0>, DQS, and /DQS received from the controller 2 to the input/output circuit 22. Furthermore, the input/output pad group 32 transfers signals DQ <7:0>, DQS, and /DQS transmitted from the input/output circuit 22 to an external device of the semiconductor memory device 5.

The ZQ calibration pad 33 has one end connected to the reference resistor 9 and the other end connected to the ZQ calibration circuit 23.

The logic control pad group 34 transfers signals /CE, CLE, ALE, /WE, RE, /RE, and /WP received from the controller 2 to the logic control circuit 24. Furthermore, the logic control pad group 34 transfers /RB transmitted from the logic control circuit 24 to an external device of the semiconductor memory device 5.

1.1.4. Configuration of Input/Output Circuit and Logic Control Circuit

Details of the configurations of the input/output circuit 22 and the logic control circuit 24 will now be explained.

1.1.4.1. Configuration According to Duty Cycle Correction Function

The input/output circuit 22 and the logic control circuit 24 have a function of correcting the duty cycle of signals DQS and /DQS received from the controller 2. In the following, the configuration according to this duty cycle correction function in the input/output circuit 22 and the logic control circuit 24 will be explained with reference to FIG. 3. FIG. 3 is a block diagram of the input/output circuit 22 and the logic control circuit 24.

As shown in FIG. 3, the input/output circuit 22 comprises input circuits 221 <7:0>, 221_dqs, and 221_bdqs, output circuits 222 <7:0>, 222_dqs, and 222_bdqs, an output control circuit 223, a resistance control circuit 224, and a detection circuit 225.

Each of the input circuits 221 <7:0> and the output circuits 222 <7:0> corresponds to signals DQ <7:0>. That is, signal DQ <k> is allocated to a set of an input circuit 221 <k> and an output circuit 222 <k> (0≤k≤7). The input circuit 221 <k> receives signal DQ <k> transmitted by the controller via a pad 32 <k> and temporarily holds the signal. In the case where signal DQ <k> is write data, the input circuit 221 <k> transmits the signal to the sense amplifier 31. On the other hand, in the case where signal DQ <k> is a command or an address, etc., the signal is transmitted to the register 26.

The output circuit 222 <k> receives signal DQ from the output control circuit 223 and temporarily holds the signal. The output circuit 222 <k> transmits signal DQ <k> in as signal DQ <k> to the controller 2 via the pad 32 <k>.

Furthermore, each of the input circuit 221_dqs and the output circuit 222_dqs corresponds to signal DQS. The input circuit 221_dqs receives signal DQS transmitted by the controller 2 via the pad 32_dqs. The received signal is transmitted to, for example, the input circuit 221 <k>, and is used as timing information when reading signal DQ <k>.

The output circuit 222_dqs receives signal DQS_in from the output control circuit 223. The output circuit 222_dqs transmits signal DQS_in as signal DQS to the controller 2 via the pad 32_dqs.

Furthermore, each of the input circuit 221_bdqs and the output circuit 222_bdqs corresponds to signal /DQS. The input circuit 221_bdqs receives signal /DQS transmitted by the controller 2 via the pad 32_bdqs. The received signal is transmitted to, for example, the input circuit 221 <k>, and is used as timing information when reading signal DQ <k>.

The output circuit 222_bdqs receives signal /DQS_in from the output control circuit 223. The output circuit 222_bdqs transmits signal /DQS_in as signal /DQS to the controller 2 via the pad 32_bdqs.

The output control circuit 223 receives signals RE_c and /RE_c from the logic control circuit 24. Furthermore, the output control circuit 223 receives data from the sense amplifier 31. The output control circuit 223 generates DQS_in and /DQS_in based on signals RE_c and /RE_c, and outputs them respectively to the output circuits 222_dqs and 222_bdqs. The output control circuit 223 generates signals DQ <7:0> _in based on the timing information of signals RE_c and /RE_c and the data received from the sense amplifier 31, and outputs them to the output circuits 222 <7:0>.

The resistance control circuit 224 controls the output impedance of the output circuits 222 <7:0>, 222_dqs, and 222_bdqs.

The detection circuit 225 detects the relationship between the duty cycle of signal DQS_in and the duty cycle of /DQS_in by monitoring signals DQS_in and /DQS_in output from the output control circuit 223. Based on the detection result, the detection circuit 225 generates signal FLG that indicates whether the duty cycle should be corrected and increased or decreased, and outputs it to the sequencer 27.

When receiving signal FLG from the detection circuit 225, the sequencer 27 generates signal DCC_CODE based on the signal. FLG, and outputs it to the logic control circuit 24. Signal DCC_CODE is a signal for correcting the duty cycle of signals RE and /RE.

The logic control circuit 24 includes a correction circuit 241. The correction circuit 241 receives signals RE and /RE from the controller 2 via the pads 34_re and 34_bre inside the logic control pad group 34. The correction circuit 241 corrects the duty cycle of the received signals RE and /RE based on signal, DCC_CODE, and generates signals RE_c and /RE_c. The duty cycle of signals DQS_in and /DQS_in and the duty cycle of signals RE_c and /RE_c are identical, or are correlated with each other.

The example of FIG. 3 shows a case in which signals RE_c and /RE_c are output directly to the output control circuit 223 from the correction circuit 241; however, this case is not limitative. For example, after the correction circuit 241 outputs signals RE_c and /RE_c to another circuit (for example, the sequencer 27), a timing signal based on the duty cycle of signals RE_c and /RE_c may be generated in the another circuit. By outputting the timing signal to the output control circuit 223, signals DQS_in and /DQS_in that are correlated with the duty cycle of signals RE_c and /RE_c may be generated.

1.1.4.2. Configuration of Detection Circuit

The configuration of the above-mentioned detection circuit 225 will now be explained with reference to FIG. 4. FIG. 4 is a block diagram of the detection circuit 225.

As shown in FIG. 4, the detection circuit 225 includes switches 41 and 42, low pass filters (LPF) 43 and 44, a switching circuit 51, and a comparator 61.

Based on signal EN given by the sequencer 27, the switch 41 transfers signal DQS_in to the LPF 43. For example, the switch 41 is turned on when signal EN is an "H" level, and transfers signal DQS_in to the LPF 43. Hereinafter, signal DQS_in transferred by the switch 41 will be referred to as signal DQS_pre. Similarly, the switch 42 transfers signal /DQS_in to the LPF 44 based on signal EN given by the sequencer 27. For example, the switch 42 is turned on when signal EN is an "H" level, and transfers signal /DQS_in to the LPF 44. Hereinafter, signal /DQS_in transferred by the switch 42 will be referred to as signal /DQS_pre.

The LPF 43 outputs a low-frequency component of signal DQS_pre to a node N1. Similarly, the LPF 44 outputs a low-frequency component of signal /DQS_pre to a node N2. The switching circuit 51 connects the node N1 to a node N3 or a node N4, and connects the node N2 to the node N3 or the node N4 based on signal SEL received from the sequencer 27. How the connection is performed will be described later.

At the comparator 61, a non-inverting input terminal is connected to the node N3, and an inverting input terminal is connected to the node N4. The comparator 61 compares the voltage of the node N3 and the voltage of the node N4, and outputs the comparison result from the output terminal to the sequencer 27 as signal FLG.

Details of the method of switching connections in the above-mentioned switching circuit 51 will now be explained with reference to FIG. 5 and FIG. 6. FIG. 5 and FIG. 6 are circuit diagrams of a part of the area of the detection circuit 225.

As shown in FIG. 5, the LPF 43 includes a resistance element 431 and a capacitor element 432.

Signal DQS_pre is provided to one end of the resistance element 431, and the other end of the resistance element 431 is connected to the node N1. The capacitor element 432 has one end of an electrode connected to the node N1, and the other end of the electrode grounded. The LPF 43 supplies signal DQS_lpf to the node N1 by cutting off a high-frequency component of signal DQS_pre.

Furthermore, the LPF 44 includes a resistance element 441 and a capacitor element 442. Signal /DQS_pre is provided to one end of the resistance element 441, and the other end of the resistance element 441 is connected to the node N2. The capacitor element 442 has one end of an electrode connected to the node N2, and the other end of the electrode grounded. The LPF 44 supplies signal /DQS_lpf to the node N2 by cutting off a high-frequency component of signal /DQS_pre.

In the first embodiment, signals DQS_pre and /DQS_pre are, for example, square waves. Cutoff frequencies of the LPF 43 and the LPF 44 are significantly low with respect to the frequencies of these signals. Accordingly, signal DQS_lpf becomes an approximately direct current voltage of a magnitude in accordance with the duty cycle of signal DQS_pre. Similarly, signal /DQS_lpf becomes an approximately direct current voltage of a magnitude in accordance with the duty cycle of signal /DQS_pre.

In the same manner, as shown in FIG. 5, the switching circuit 51 includes switches 511 to 514.

When signal SEL is, for example, an "L" level, the switch 511 connects the node N1 to the node N3, and transfers signal DQS_lpf to the node N3. Such aspect is shown in FIG. 5. On the other hand, when signal SEL is an "H" level, the node N1 and the node N3 are disconnected. When signal SEL is an "H" level, the switch 512 connects the node N1 to the node N4, and transfers signal DQS_lpf to the node N4. Such aspect is shown in FIG. 6. On the other hand, when signal SEL is an "L" level, the node N1 and the node N4 are disconnected.

When signal SEL is, for example, an "H" level, the switch 513 connects the node N2 to the node N3, and transfers signal /DQS_lpf to the node N3. Such aspect is shown in FIG. 6. On the other hand, when signal SEL is an "L" level, the node N2 and the node N3 are disconnected. When signal SEL is an "L" level, the switch 514 connects the node N2 to the node N4, and transfers signal /DQS_lpf to the node N4. Such aspect is shown in FIG. 5. On the other hand, when signal SEL is an "H" level, the node N2 and the node N4 are disconnected.

Hereinafter, a state in which signal SEL is an "L" level, and the node N1 and the node N3 are electrically connected, and the node N2 and the node N4 are electrically connected will be referred to as a "first connection". On the other hand, a state in which signal SEL is an "H" level, and the node N1 and the node N4 are electrically connected, and the node N2 and the node N3 are electrically connected will be referred to as a "second connection".

1.2. Operation

An operation of the memory system according to the first embodiment will now be explained.

1.2.1. Operation of Semiconductor Memory Device Upon Activation

An operation of the memory system according to the first embodiment upon activation will be roughly explained with reference to the flowchart shown in FIG. 7.

Figure 7:
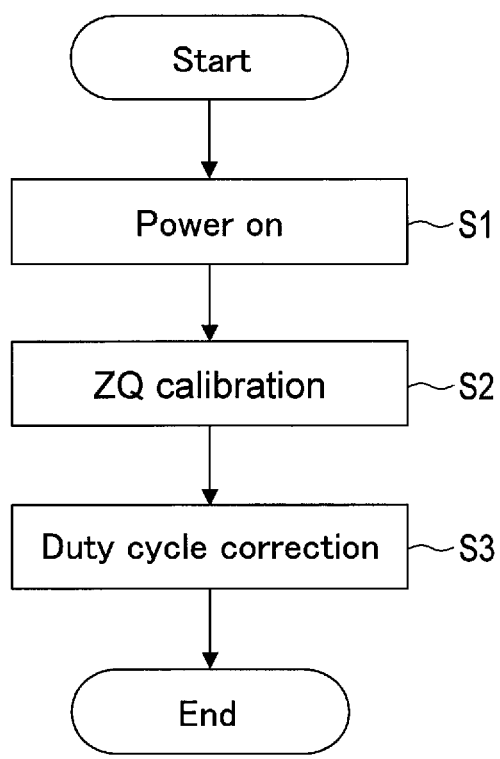
FIG. 7 is a flowchart showing an example of a sequence after turning on power of the semiconductor memory device according to the first embodiment.

As shown in FIG. 7, when power of the memory system 1 is turned on in step S1, the semiconductor memory device 5 executes a ZQ calibration operation in step S2. The ZQ calibration operation is an operation for calibrating an output impedance of the output circuit.

In step S3, the semiconductor memory device 5 executes a duty cycle correction operation. That is, when generating signals DQS_in and /DQS_in based on signals RE and /RE received from the controller 2, the semiconductor memory device 5 corrects signals RE and /RE so that the duty cycle of signals DQS_in and /DQS_in becomes approximately 50%.

The operation upon activation of the semiconductor memory device 5 is thus ended.

1.2.2. Duty Cycle Correction Operation

Figure 8:
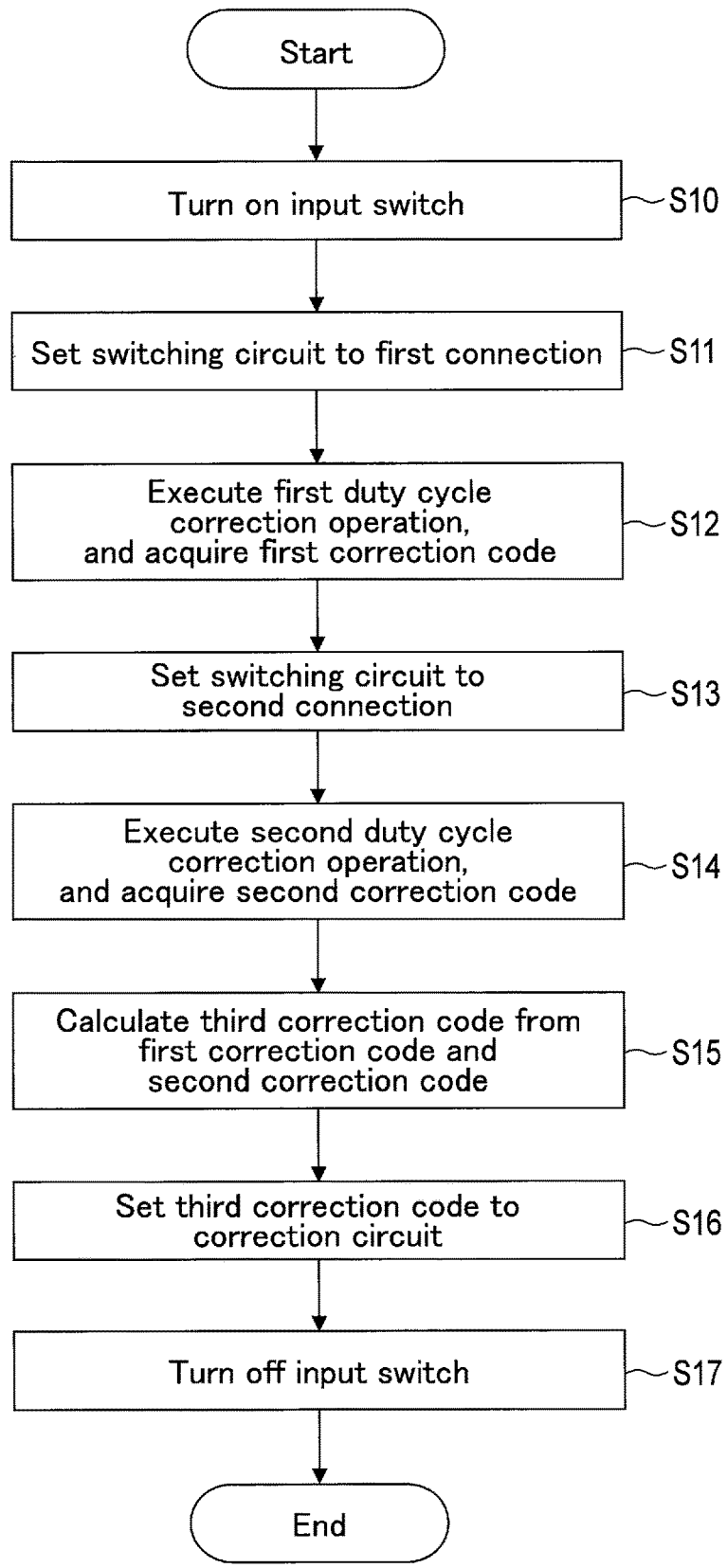
FIG. 8 is a flowchart showing an example of a duty cycle correction operation in the semiconductor memory device according to the first embodiment.

Details of the above-mentioned step S3 will now be explained with reference to FIG. 8. FIG. 8 is a flowchart showing details of the duty cycle correction operation. The duty cycle correction operation is performed in a state where the controller 2 transmits signals RE and /RE to the semiconductor memory device 5.

As shown in FIG. 8, in step S10, the detection circuit 225 turns on the switches 41 and 42 based on signal EN from the sequencer 27. By turning on the switch 41, signal DQS_in is transferred to the LPF 43 as signal DQS_pre. Similarly, by turning on the switch 42, signal /DQS_in is transferred to the LPF 44 as signal /DQS_pre.

The LPF 43 cuts off a high-frequency component of signal DQS_pre, and outputs signal DQS_lpf to the node N1. Similarly, the LPF 44 cuts off a high-frequency component of signal /DQS_pre, and outputs signal /DQS_lpf to the node N2.

In step S11, based on signal SEL (="L") from the sequencer 27, the detection circuit 225 has the switching circuit 51 set as the first connection. In this manner, signal DQS_lpf is applied to the non-inverting input terminal of the comparator 61. Similarly, signal /DQS_lpf is applied to the inverting input terminal of the comparator 61.

In step S12, the sequencer 27 executes a first duty cycle correction operation and acquires a first correction code. In the first duty cycle correction operation, in the case where the comparator 61 determines that signal DQS_lpf is larger than signal /DQS_lpf, that is, in the case where the duty cycle is determined as being larger than 50%, an "H" level is output as signal FLG. In this case, based on signal FLG, the sequencer 27 sets signal DCC_CODE so that the duty cycle becomes smaller, and transmits it to the correction circuit 241. The correction circuit 241 corrects the duty cycle of signals RE and /RE based on the received signal DCC_CODE, and outputs signals RE_c and /RE_c.

In contrast, in the case where the comparator 61 determines that signal DQS_lpf is smaller than signal /DQS_lpf, that is, in the case where the duty cycle is determined as being smaller than 50%, the comparator 61 outputs an "L" level as signal FLG. In this case, based on signal FLG, the sequencer 27 sets signal DCC_CODE so that the duty cycle becomes larger, and transmits it to the correction circuit 241. The correction circuit 241 corrects the duty cycle of signals RE and /RE based on the received signal DCC_CODE, and outputs signal RE_c and /RE_c.

In the above manner, by changing signal DCC_CODE in accordance with signal FLG, the sequencer 27 searches for signal DCC_CODE in which signal DQS_lpf and signal /DQS_lpf are almost equal, that is, in which the duty cycle is detected as being approximately 50%. When signal DCC_CODE (for example, signal DCC_CODE that is set immediately before signal FLG output from the comparator 61 of the detection circuit 225 is inverted from an "H" level to an "L" level) in which the duty cycle is determined as being approximately 50% is searched for, the sequencer 27 acquires the signal DCC_CODE as the first correction code, and ends step S12.

In step S13, based on signal SEL (="H") from the sequencer 27, the detection circuit 225 has the switching circuit 51 set as the second connection. In this manner, signal /DQS_lpf is applied to the non-inverting input terminal of the comparator 61. Similarly, signal DQS_lpf is applied to the inverting input terminal of the comparator 61.

In step S14, the sequencer 27 executes a second duty cycle correction operation and acquires a second correction code. In the second duty cycle correction operation, in the case where the comparator 61 determines that signal DQS_lpf is larger than signal /DQS_lpf, that is, in the case where the duty cycle is determined as being larger than 50%, an "L" level is output as signal FLG. In this case, based on signal FLG, the sequencer 27 sets signal DCC_CODE so that the duty cycle becomes smaller, and transmits it to the correction circuit 241. The correction circuit 241 corrects the duty cycle of signals RE and /RE based on the received signal DCC_CODE, and outputs signals RE_c and /RE_c.

In contrast, in the case where the comparator 61 determines that signal DQS_lpf is smaller than signal /DQS_lpf, that is, in the case where the duty cycle is determined as being smaller than 50%, the comparator 61 outputs an "H"

level as signal FLG. In this case, based on signal FLG, the sequencer 27 sets signal DCC_CODE so that the duty cycle becomes larger, and transmits it to the correction circuit 241. The correction circuit 241 corrects the duty cycle of signals RE and /RE based on the received signal DCC_CODE, and outputs signals RE_c and /RE_c.

In the above manner, by changing signal DCC_CODE in accordance with signal FLG, the sequencer 27 searches for signal DCC_CODE in which signal DQS_lpf and signal /DQS_lpf are almost equal, that is, in which the duty cycle is detected as being approximately 50%. When signal DCC_CODE (for example, signal DCC_CODE that is set immediately before signal FLG output from the comparator 61 of the detection circuit 225 is inverted from an "L" level to an "H" level) in which the duty cycle is determined as being approximately 50% is searched for, the sequencer 27 acquires the signal DCC_CODE as the second correction code, and ends step S14.

In step S15, the sequencer 27 calculates a third correction code from the first correction code and the second correction code. The calculation method is, for example, a center value of the first correction code and the second correction code. Alternatively, in the case where the calculation result includes a fraction, the correction code may be rounded up, or may be rounded down.

In step S16, the sequencer 27 sets the third correction code in the correction circuit 241. The correction circuit 241 corrects the duty cycle of signals RE and /RE based on the received third correction code, and outputs signals RE_c and /RE_c.

In step S17, the detection circuit 225 turns off the switches 41 and 42 based on signal EN from the sequencer 27. By turning off the switches 41 and 42, the detection circuit 225 ends the duty cycle correction operation.

Subsequently, the semiconductor memory device 5 outputs data in sync with signal DQS, in which the duty cycle is corrected, to the controller.

1.3. Advantageous Effect of First Embodiment

According to the first embodiment, when correcting the duty cycle, the influence caused by the offset of the comparator can be reduced, and operation reliability of the semiconductor memory device can be improved. The advantageous effect will be explained below.

Due to the variation upon production, in the comparator, determination threshold values vary. Regarding the variation in the determination threshold values, by providing a voltage source corresponding to the variation on an input terminal with respect to an ideal comparator that does not vary, the threshold values can be expressed equivalently.

A circuit diagram in which the comparator 61 is replaced with an ideal comparator 60 and an input offset voltage Voff is shown in FIG. 9 and FIG. 10. As illustrated, the node N3 is connected to a non-inverting input terminal of the ideal comparator 60. The node N4 is connected to a negative side terminal of the input offset voltage Voff. A positive side terminal of the input offset voltage Voff is connected to an inverting input terminal of the ideal comparator 60.

Here, in FIG. 9, since signal SEL is an "L" level, the switching circuit 51 is set as the first connection. Accordingly, the node N1 and the node N3 are electrically connected, and the node N2 and the node N4 are electrically connected. As a result, signal DQS_lpf is applied to the non-inverting input terminal of the ideal comparator 60. Similarly, a voltage obtained as a result of adding the input offset voltage Voff to signal /DQS_lpf is applied to the inverting input terminal of the ideal comparator 60.

FIG. 10 shows a case in which signal SEL is an "H" level. Accordingly, in the case of FIG. 10, the node N1 and the node N4 are electrically connected, and the node N2 and the node N3 are electrically connected. As a result, signal /DQS_lpf is applied to the non-inverting input terminal of the ideal comparator 60. Similarly, a voltage obtained as a result of adding the input offset voltage Voff to signal DQS_lpf is applied to the inverting input terminal of the ideal comparator 60.

Figure 11:
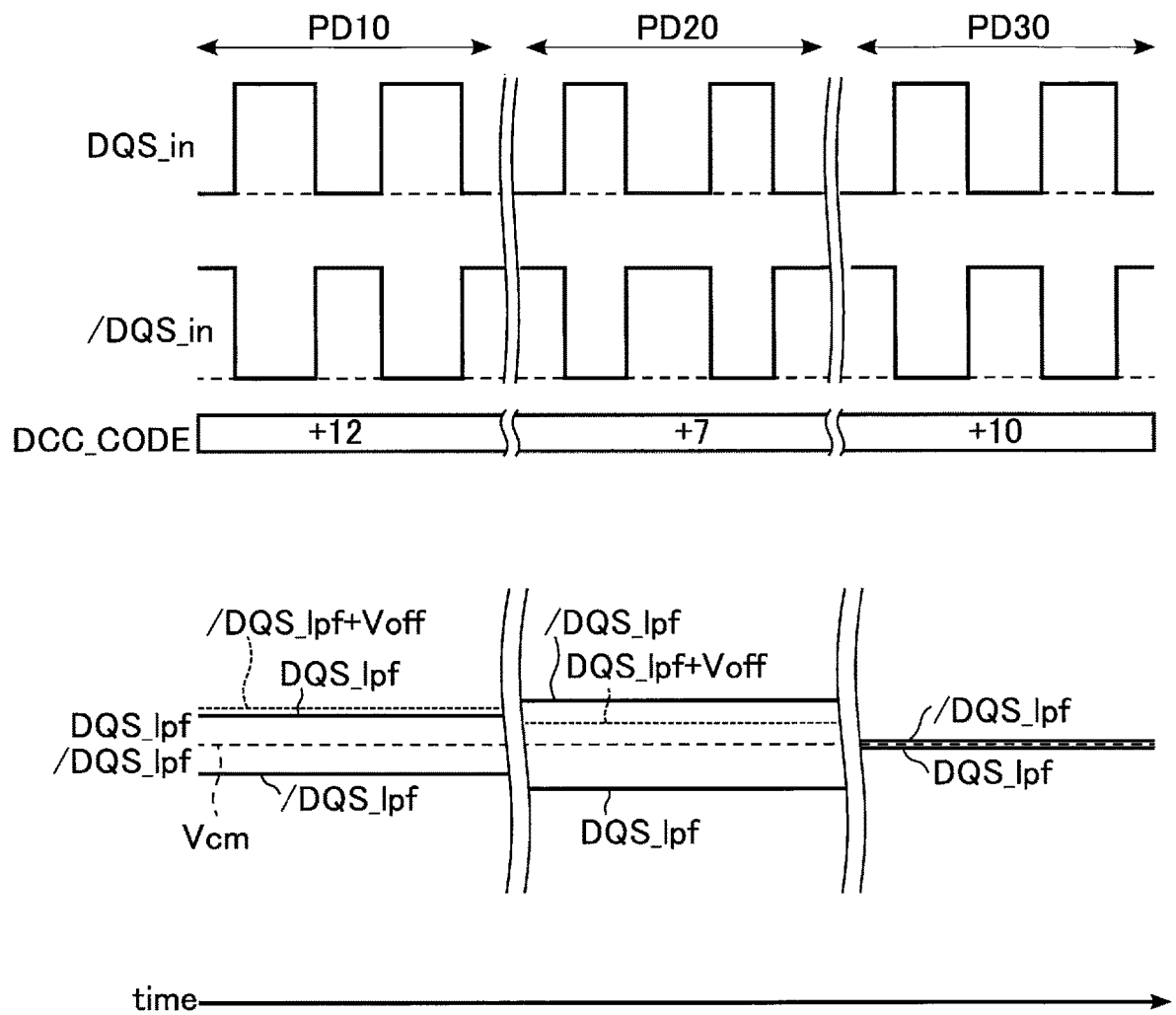
FIG. 11 is a diagram showing an example of the duty cycle correction operation in the semiconductor memory device according to the first embodiment.

In the above manner, to switch connections between the first connection and the second connection by the switching circuit 51 is equal to replacing a signal influenced by an offset with /DQS_lpf and DQS_lpf in the case of equivalently expressing the determination threshold value using the ideal comparator 60. FIG. 11 will be explained in consideration of an equivalent circuit using the ideal comparator 60 and the input offset voltage Voff.

FIG. 11 is a diagram expressing various signal waves and correction codes regarding the duty cycle correction operation. The example of FIG. 11 shows a case in which the input offset voltage Voff is positive. Period PD10 corresponds to a state in which the first correction code is determined in step S12 of FIG. 8. Period PD20 corresponds to a state in which the second correction code is determined in step S14 of FIG. 8. Period PD30 corresponds to a state in which the third correction code is set in the correction circuit 241 in step S16 of FIG. 8. Furthermore, a voltage Vcm illustrated together with signal DQS_lpf and signal /DQS_lpf is a voltage that is half the amplitude of signal DQS_in. When the duty cycle of signal DQS_in is 50%, the voltage of signal DQS_lpf becomes equal to the Vcm.

In period PD10, the switching circuit 51 is set as the first connection. That is, in the equivalent circuit, signal DQS_lpf is applied to the non-inverting input terminal of the ideal comparator 60, and a voltage obtained by adding the input offset voltage Voff to signal /DQS_lpf is applied to the inverting input terminal. In the detection circuit 225 according to the first embodiment, a state in which the voltage to be applied to the non-inverting input terminal and the voltage to be applied to the inverting input terminal are almost equal is determined as the duty cycle being approximately 50%. Accordingly, to make signal DQS_lpf and the voltage obtained by adding the input offset voltage Voff to signal /DQS_lpf almost equal, for example, "+12" is determined as the first correction code. As a result, the duty cycle of signal DQS_in becomes larger than 50%.

In contrast, in period PD20, the switching circuit 51 is set as the second connection. That is, in the equivalent circuit, signal /DQS_lpf is applied to the non-inverting input terminal of the ideal comparator 60, and a voltage obtained by adding the input offset voltage Voff to signal DQS_lpf is applied to the inverting input terminal. As a result, to make signal /DQS_lpf and the voltage obtained by adding the input offset voltage Voff to signal DQS_lpf almost equal, for example, "+7" is determined as the second correction code. As a result, the duty cycle of signal DQS_in becomes smaller than 50%.

In period PD30, from "+12", which is the first correction code, and "+7", which is the second correction code, "+10" is calculated as the third correction code. The first correction code is determined in a state where signal /DQS_lpf can be regarded as being influenced by the input offset voltage Voff. Furthermore, the second correction code is determined in a state where signal DQS_lpf can be regarded as being influenced by the input offset voltage Voff. In other words, all of the correction codes include components based on the same voltage Voff. Accordingly, by calculating the third correction code from the first correction code and the second correction code, the influence of the input offset voltage Voff can be canceled, and the influence of the voltage Voff to the correction code can be suppressed. As a result, the duty cycle of signal DQS_in becomes approximately 50%, which is the targeted value.

As a result of the above, the semiconductor memory device 5 is capable of generating signals DQS and /DQS with a duty cycle of approximately 50%, and is capable of improving operation reliability of the semiconductor memory device 5.

Furthermore, in the semiconductor memory device 5 according to the present embodiment, the switching circuit 51 is added, and the third correction value is calculated from the first correction value and the second correction value. Accordingly, a circuit for adjusting the offset of the comparator to zero becomes unnecessary, and, since the switching circuit 51 is a group of switches, circuit dimensions may be expected to become smaller than those of such circuit. Accordingly, the influence of the offset of the comparator can be suppressed while suppressing an increase in circuit dimensions, and the operation reliability of the semiconductor memory device 5 can be improved.

Furthermore, in the present embodiment, the detection circuit 225 is provided at the front stage of the output circuit 222_*dqs* that generates signal DQS, and the duty cycle of signal DQS_in is corrected by this detection circuit 225. Accordingly, not only in the case where the duty cycle of signal RE received from an external device is inappropriate, but also in a case where the duty cycle deviates inside the semiconductor memory device; for example, a path from the correction circuit 241 to the output control circuit 223, or inside the output control circuit 223, such deviation can be corrected. As a result, signal DQS with a suitable duty cycle can be generated, thereby improving read operation reliability.

2. Second Embodiment

A semiconductor memory device according to a second embodiment will now be explained. The present embodiment relates to details on an acquisition method of the correction code explained with reference to FIG. 11 in the above-mentioned first embodiment. Hereinafter, explanations on parts that are similar to those of the first embodiment will be omitted.

2.1. First Duty Cycle Correction Operation

Regarding the duty cycle correction operation of the semiconductor memory device according to the second embodiment, first of all, the first duty cycle correction operation will be explained with reference to FIG. 12. FIG. 12 is a flowchart corresponding to step S12 of FIG. 8 explained in the first embodiment.

As explained in the first embodiment, the sequencer 27 generates signal DCC_CODE based on signal FLG. The duty cycle of signals RE and /RE is corrected based on the signal DCC_CODE. That is, signal DCC_CODE may be considered as a parameter that controls the duty cycle correction. The present embodiment relates to a method of searching for a suitable signal DCC_CODE. In the following, signal DCC_CODE will be explained as, for example, a parameter of a plurality of bits.

As shown in FIG. 12, in step S20, the sequencer 27 resets the number of search times of DCC_CODE (i=1, i is the number of search times) in accordance with the need.

In step S21, the sequencer 27 initializes DCC_CODE and sets it to "0". When DCC_CODE is set to "0", the correction circuit 241 does not correct the duty cycle. The correction circuit 241 outputs signals RE_c and /RE_c based on signals RE and /RE. Signals RE_c and /RE_c are input to the output control circuit 223, and the output control circuit 223 outputs signals DQS_in and /DQS_in. The detection circuit 225 receives signals DQS_in and /DQS_in, and outputs signal FLG, which is the determination result, to the sequencer 27.

In step S22, the sequencer 27 determines whether the duty cycle of signal DQS_in is larger or smaller than 50% based on signal FLG. In the case where FLG="H" (step S22, Yes), that is, in the case where the duty cycle of signal DQS_in is determined as being larger than 50%, the sequencer 27 executes step S23.

In step S23, the sequencer 27 decrements DCC_CODE. When DCC_CODE is decremented, the correction circuit 241 changes a correction amount so that the duty cycle is decreased based on DCC_CODE. The sequencer 27 executes step S24.

In step S24, the sequencer 27 determines whether the duty cycle of signal DQS_in is larger or smaller than 50% based on signal FLG. In the case where FLG="H" (step S24, Yes), the duty cycle of signal DQS_in is determined as being larger than 50%. The sequencer 27 executes step S25.

In step S25, the sequencer 27 determines whether or not the number of search times "i" up to now is smaller than a maximum number of search times "Max". The maximum number of times "Max" is used to set an upper limit of the number of search times of DCC_CODE. In the case where the number of search times "i" is smaller than the maximum number of times "Max" (step S25, Yes), the operation proceeds to step S26, and the sequencer 27 increments the number of search times "i" and repeats the operation thereafter step S23.

In step S24, in the case where signal FLG is "L" (step S24, No), the sequencer 27 determines that the duty cycle of signal DQS_in is smaller than 50%, and proceeds to step S27. This case corresponds to a case in which, as a result of duty cycle correction, signal FLG is inverted from an "H" level to an "L" level.

In step S27, the sequencer 27 increments DCC_CODE. The sequencer 27 then executes step S33. That is, the sequencer 27 acquires DCC_CODE obtained in step S27, and holds it in, for example, a register. DCC_CODE acquired in step S33 corresponds to the first correction code. The first duty cycle correction operation is thus ended.

Furthermore, in step S25, also in the case where i≥Max (step S25, No), the sequencer 27 executes step S33. That is, even if signal FLG is not inverted since the number of search times of DCC_CODE has reached the maximum value, the sequencer 27 acquires DCC_CODE that is obtained at the moment.

In step S22, in the case where FLG="L" (step S22, No), the sequencer 27 executes step S28.

In step S28, the sequencer 27 increments DCC_CODE. In the case where DCC_CODE is incremented, the correction circuit 241 changes a correction amount based on DCC_CODE so that the duty cycle is increased to the contrary of the case of step S23. The sequencer 27 then executes step S29.

In step S29, the sequencer 27 determines whether the duty cycle of signal DQS_in is larger or smaller than 50% based on signal FLG. In the case where FLG="L" (step S29, Yes), that is, in the case where the duty cycle of signal DQS_in is determined as being smaller than 50%, the sequencer 27 executes step S30.

In step S30, the sequencer 27 determines whether or not the number of search times "i" is smaller than the maximum value "Max". In the case where the number of search times "i" is smaller than the maximum value "Max" (step S25, Yes), the operation proceeds to step S31, and the sequencer 27 increments the number of search times "i" and repeats the process thereafter step S28.

In step S29, in the case where signal FLG is an "H" level (step S29, No), the sequencer 27 determines that the duty cycle of signal DQS_in is larger than 50%, and proceeds to step S32. Contrary to the case of step S24 mentioned above, this case corresponds to a case in which, as a result of duty cycle correction, signal FLG is inverted from an "L" level to an "H" level.

In step S32, the sequencer 27 decrements DCC_CODE. Step S33 is then executed. Furthermore, in step S30, also in the case where i≥Max (step S30, No), the sequencer 27 executes step S33 in the same manner as in the case of step S25 mentioned above.

Figure 13:
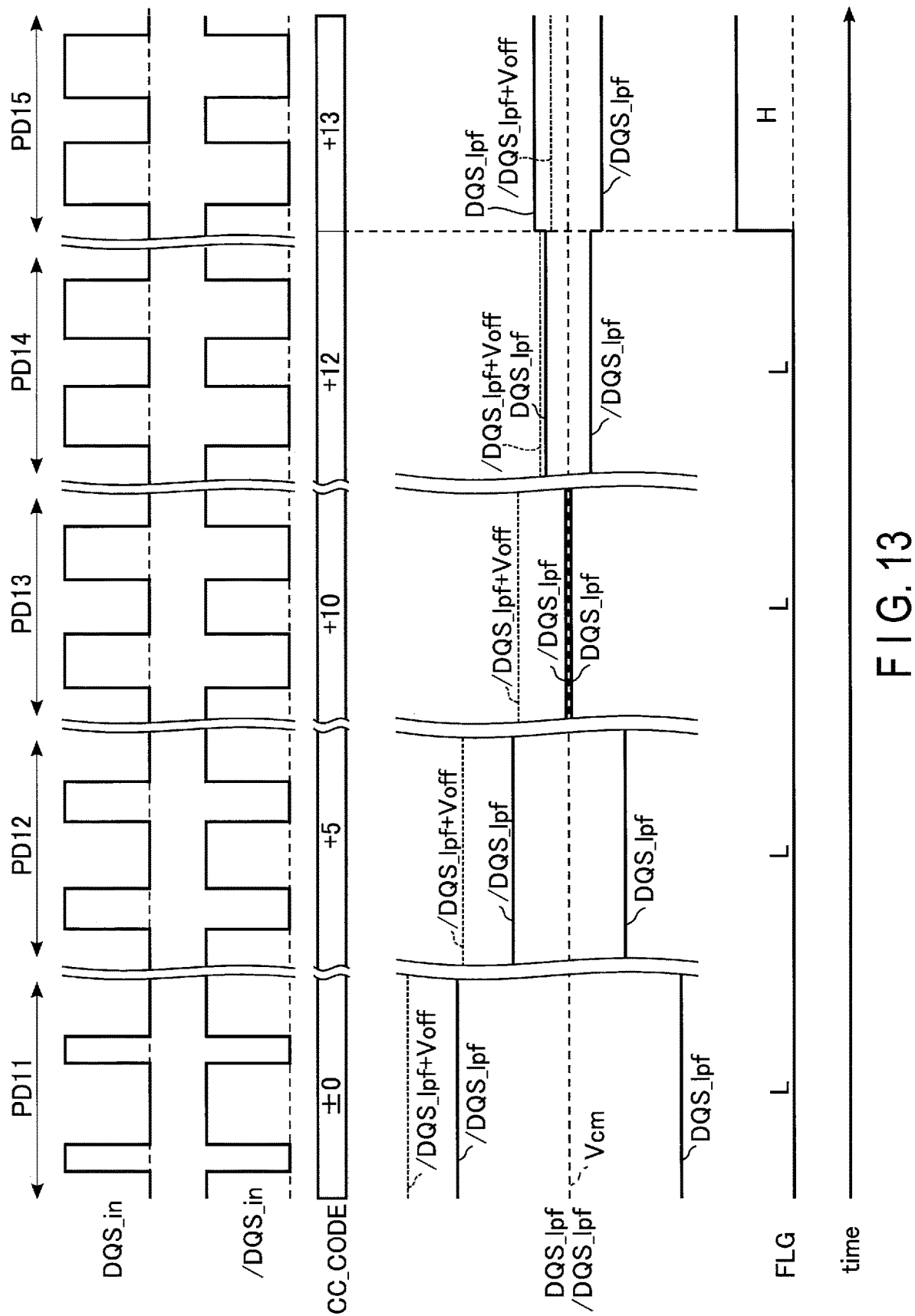
FIG. 13 is a diagram showing an example of the duty cycle correction operation in the semiconductor memory device according to the second embodiment.

FIG. 13 is a diagram indicating the aspect of various signals when the value of DCC_CODE is being changed in the first duty cycle correction operation. In FIG. 13, an example will be explained in which, in a state where the duty cycle correction is not performed, the duty cycle of signal DQS_in is lower than 50%, and an input offset voltage Voff is a positive value. The aspect of the duty cycle being corrected will be explained with reference to FIG. 13.

In period PD11, DCC_CODE is set to "0". This is a state explained in step S21 of FIG. 12, in which DCC_CODE is initialized. In this case, in the present example the duty cycle of signal DQS_in is smaller than 50%, and the voltage of signal DQS_lpf is lower than Vcm. On the other hand, the duty cycle of signal /DQS_in is larger than 50%, and the voltage of signal /DQS_lpf is higher than Vcm. Furthermore, as explained in the first embodiment, in the case of considering a model of an ideal comparator in which the input offset voltage Voff is connected to the inverting input terminal, the voltage of signal /DQS_lpf can be considered as being higher by the input offset voltage Voff. DQS_lpf+Voff is also shown by a broken line. Since the detection circuit 225 outputs signal FLG of an "L" level, DCC_CODE is incremented in the manner explained in step S28 of FIG. 12.

As a result of executing the processes of steps S28 to S31 explained in FIG. 12, in period PD12, DCC_CODE is set to "+5". The duty cycle of signal DQS_in has become larger than that in period PD11; however, remains smaller than 50%. Accordingly, signal FLG maintains an "L" level, and DCC_CODE is continuously incremented.

In period PD13, it is assumed that DCC_CODE is set to "+10", and the duty cycle of signal DQS_in is approximately 50%. Accordingly, the voltage of signal DQS_lpf and the voltage of signal /DQS_lpf are both values close to Vcm. However, since the voltage of signal /DQS_lpf is higher than the voltage of signal DQS_lpf, signal FLG maintains an "L" level.

In period PD14, it is assumed that DCC_CODE is set to "+12", and the duty cycle of signal DQS_in is larger than 50%. The voltage of signal DQS_lpf is higher than the voltage of signal /DQS_lpf. However, since the voltage of /DQS_lpf Voff, in which the input offset voltage Voff is considered, is higher than the voltage of signal DQS_lpf, signal FLG maintains an "L" level.

Furthermore, in period PD15, DCC_CODE is set to "+13", and the duty cycle of signal DQS_in is larger than that in the state of period PD14. As a result, since the voltage of signal DQS_lpf exceeds a value obtained by adding the input offset voltage Voff to the voltage of signal /DQS_lpf, signal FLG changes from an "L" level to an "H" level. By the signal FLG, the operation of "step S29, No" explained in FIG. 12 is performed, and the decrement of DCC_CODE explained in step S32 is performed. "+12" is acquired as the first correction code, and the first duty cycle correction operation is completed.

2.2. Second Duty Cycle Correction Operation

The second duty cycle correction operation will now be explained with reference to FIG. 14. FIG. 14 is a flowchart corresponding to step S14 of FIG. 8 explained in the first embodiment.

As illustrated, the second duty cycle correction operation is obtained by switching steps S23 and S28, and further, switching steps S27 and S32 in the first duty cycle correction operation explained in FIG. 12. The rest of the steps are the same as FIG. 12. That is, in the second duty cycle correction operation, when signal FLG is an "H" level when DCC_CODE is initialized, DCC_CODE is incremented until FLG is inverted to an "L" level. On the other hand, when signal FLG is an "L" level when DCC_CODE is initialized, DCC_CODE is decremented until FLG is inverted to an "H" level.

Figure 15:
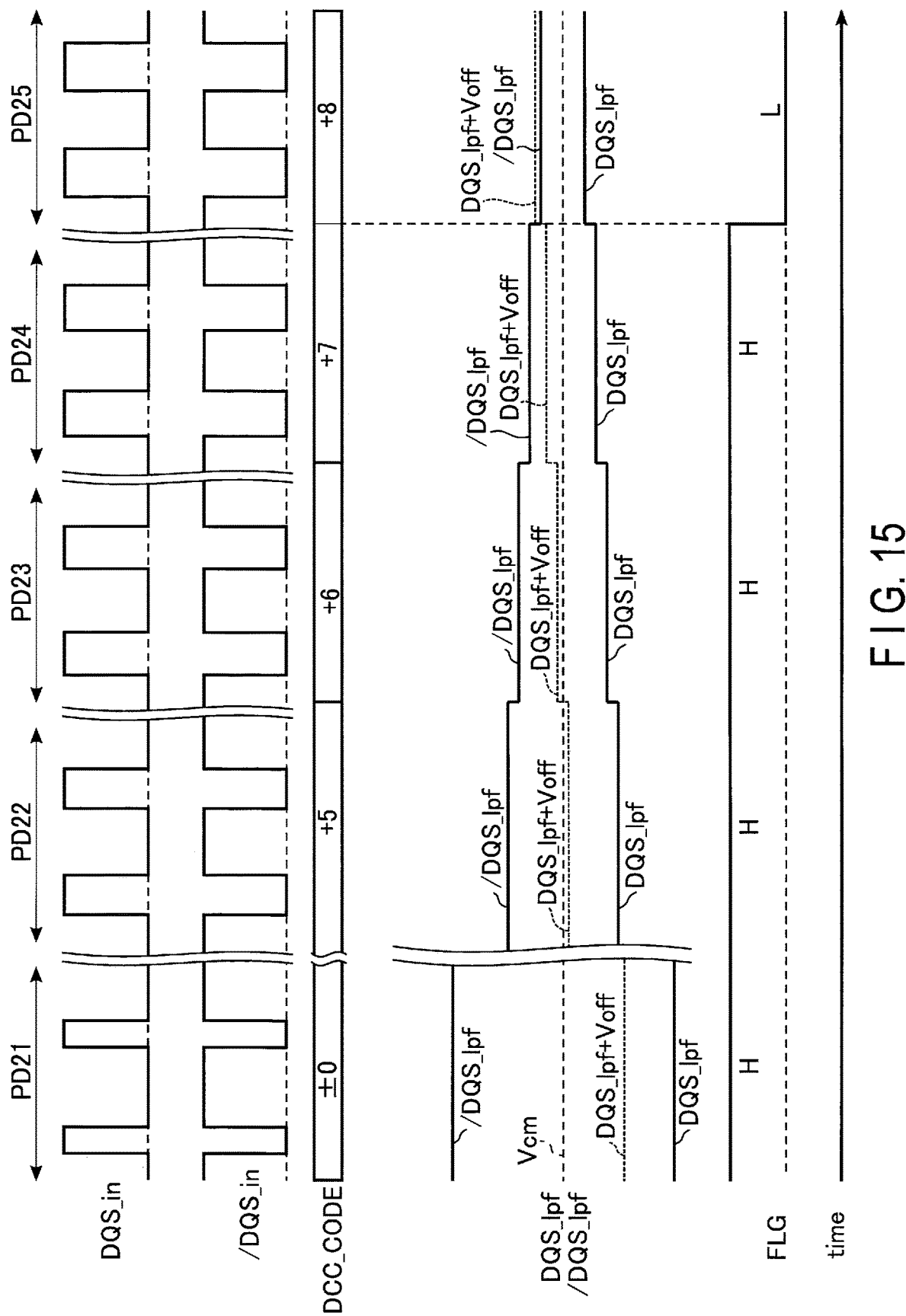
FIG. 15 is a diagram showing an example of the duty cycle correction operation in the semiconductor memory device according to the second embodiment.

FIG. 15 is a diagram indicating the aspect of various signals when the value of DCC_CODE is being changed in the second duty cycle correction operation, and corresponds to FIG. 13 explained in the first duty cycle correction operation.

In period PD21, DCC_CODE is set to "0" (step S21). In this state, the duty cycle of signal DQS_in is smaller than 50%, and the voltage of signal DQS_lpf is lower than Vcm. On the other hand, the duty cycle of signal /DQS_in is larger than 50%, and the voltage of signal /DQS_lpf is higher than Vcm. Accordingly, the detection circuit 225 outputs signal FLG of an "H" level (step S22, Yes), and DCC_CODE is incremented (step S28).

Subsequently, in the same manner as in the case of FIG. 13, DCC_CODE is incremented until signal FLG is inverted (in the present example, from the "H" level to the "L" level). In the example of FIG. 15, signal FLG is inverted between periods PD24 and PD25. The DCC_CODE when signal FLG becomes an "L" level is, for example, "+8". Accordingly, in the present example, "+7" is acquired as the second correction code, and the second duty cycle correction operation is completed.

2.3. Advantageous Effect of Second Embodiment

In the manner mentioned above, the first duty cycle correction operation and second duty cycle correction operation explained in the first embodiment can be executed using, for example, the method explained in the present embodiment.

3. Third Embodiment

A semiconductor memory device according to a third embodiment will now be explained. The present embodiment relates a configuration example of the correction circuit 241 explained in the first embodiment. Hereinafter, explanations on parts that are similar to those of the first embodiment will be omitted.

3.1. Configuration of Correction Circuit

Figure 16:
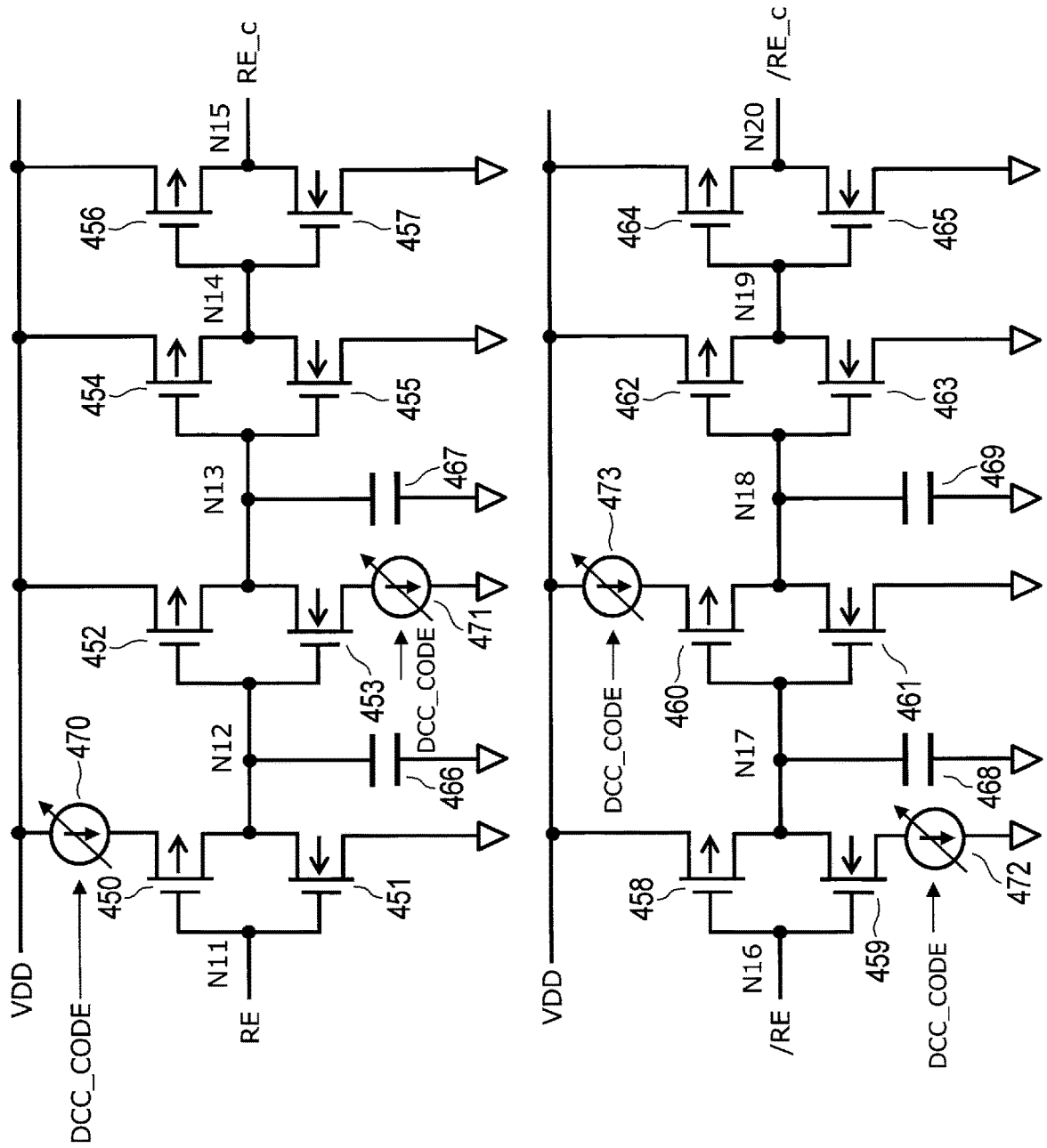
FIG. 16 is a circuit diagram showing an example of a correction circuit provided in a semiconductor memory device according to a third embodiment.

FIG. 16 is a circuit diagram showing an example of a configuration of the correction circuit 241 according to the present embodiment.

As shown in FIG. 16, the correction circuit 241 comprises p-channel MOS transistors 450, 452, 454, 456, 458, 460, 462, and 464, n-channel MOS transistors 451, 453, 455, 457, 459, 461, 463, and 465, capacitor elements 466 to 469, and variable current sources 470 to 473.

A power supply voltage VDD is supplied to the variable current source 470, and a constant current is supplied to a source of the transistor 450. The transistor 450 has a gate connected to a node N11, and a drain connected to a node N12. The transistor 451 has a gate connected to the node N11, a source grounded, and a drain connected to the node N12. The capacitor element 466 has one end of an electrode connected to the node N12, and the other end of the electrode grounded.

The transistor 452 has a gate connected to the node N12, a source to which the power supply voltage VDD is applied, and a drain connected to a node N13. The transistor 453 has a gate connected to the node N12, and a drain connected to the node N13. The variable current source 471 supplies a constant current that flows from a source of the transistor 453 to a ground node. The capacitor element 467 has one end of an electrode connected to the node N13, and the other end of the electrode grounded.

The transistor 454 has a gate connected to the node N13, a source to which the power supply voltage VDD is applied, and a drain connected to a node N14. The transistor 455 has a gate connected to the node N13, a source grounded, and a drain connected to the node N14.

The transistor 456 has a gate connected to the node N14, a source to which the power supply voltage VDD is applied, and a drain connected to a node N15. The transistor 457 has a gate connected to the node N14, a source grounded, and a drain connected to the node N15.

In the above configuration, signal RE is input to the node N11, and signal RE_c is output from the node N15. Signal DCC_CODE is input to the variable current sources 470 and 471, and the variable current sources 470 and 471 function as a current source of a current amount in accordance with signal DCC_CODE. That is, the duty cycle of signal RE is controlled by varying the current amount supplied from the variable current sources 470 and 471 by the signal DCC_CODE.

The transistor 458 has a gate connected to a node N16, a source to which the power supply voltage VDD is applied, and a drain connected to a node N17. The transistor 459 has a gate connected to the node N16, and a drain connected to the node N17. The variable current source 472 supplies a constant current that flows from a source of the transistor 459 to a ground node. The capacitor element 468 has one end of an electrode connected to the node N17, and the other end of the electrode grounded. The power supply voltage VDD is supplied to the variable current source 473, and a constant current is supplied to a source of the transistor 460. The transistor 460 has a gate connected to the node N17, and a drain connected to a node N18. The transistor 461 has a gate connected to the node N17, a source grounded, and a drain connected to the node N18. The capacitor element 469 has one end of an electrode connected to the node N18, and the other end of the electrode grounded. The transistor 462 has a gate connected to the node N18, a source to which the power supply voltage VDD is applied, and a drain connected to a node N19. The transistor 463 has a gate connected to the node N18, a source grounded, and a drain connected to the node N19. The transistor 464 has a gate connected to the node N19, a source to which the power supply voltage VDD is applied, and a drain connected to a node N20. The transistor 465 has a gate connected to the node N19, a source grounded, and a drain connected to the node N20.

In the above configuration, signal /RE is input to the node N16, and signal /RE_c is output from the node N20. Signal DCC_CODE is input to the variable current sources 472 and 473, and the variable current sources 472 and 473 function as a current source of a current amount in accordance with signal DCC_CODE. That is, the duty cycle of signal /RE can be controlled by varying the current amount supplied from the variable current sources 472 and 473 by the signal DCC_CODE.

3.2. Operation of Correction Circuit

Figure 17:
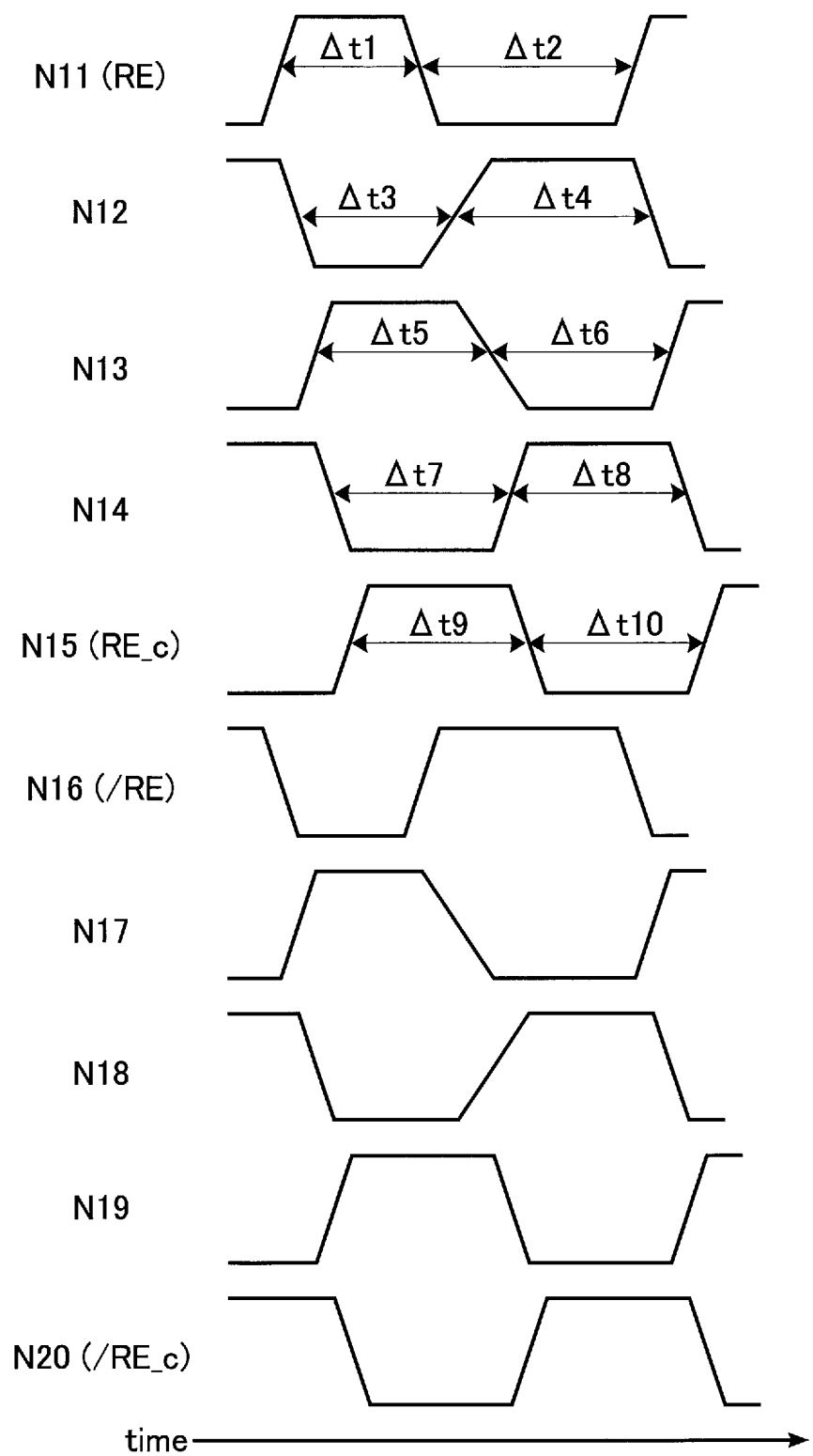
FIG. 17 is a waveform diagram showing an example of an operation of the correction circuit provided in the semiconductor memory device according to the third embodiment.

The operation of the correction circuit 241 in the semiconductor storage device according to the third embodiment will be explained with reference to FIG. 17. FIG. 17 shows an outline of a voltage waveform in each node of the correction circuit 241.

As shown in FIG. 17, signal RE is applied to the node N11. In the example of FIG. 17, in signal RE, term Δt2 of an "L" level is longer than term Δt1 of an "H" level. That is, the duty cycle is smaller than 50%. The signal applied to the node N11 is inverted by an inverter formed by the transistors 450 and 451, and is output to the node N12. At this time, the inverter charges and discharges the capacitor element 466 that is connected to the node N12. Furthermore, the rising speed of a waveform of this inverter is controlled by the variable current source 470 in accordance with the current amount set by signal DCC_CODE. As a result, in the case of the present example, a waveform that requires time to rise is output to the node N12, and term Δt3 of an "L" level in the node N12 becomes longer than term Δt1 of an "H" level in the node N11. On the other hand, term Δt4 of an "H" level in the node N12 becomes shorter than term Δt2 of an "L" level in the node N11.

An inverter formed by the transistors 452 and 453 inverts the signal in the node N12, and outputs it to the node N13. At this time, in the same manner, the inverter charges and discharges the capacitor that is connected to the node N13, and, furthermore, has the rising speed of the waveform controlled by the variable current source 471 in accordance with the current amount set by signal DCC_CODE. As a result, in the case of the present example, a waveform that requires time to fall is output to the node N13, and term Δt5 of an "H" level in the node N13 becomes longer than term Δt3 of an "L" level in the node N12. On the other hand, term Δt6 of an "L" level in the node N13 becomes shorter than term Δt4 of an "H" level in the node N12.

As a result, in the node N13, term Δt5 of an "H" level becomes equal to term Δt6 of an "L" level. However, a time required for the waveform to rise and a time required for the waveform to fall differ.

The signal in which the duty cycle is 50% as mentioned above is inverted by an inverter formed by the transistors 454 and 455, and is output to the node N14. The current control performed by the variable current source is not provided on such inverter. Accordingly, a waveform that requires almost the same time for rising and falling is output to the node N14. Furthermore, an inverter formed by the transistors 456 and 457 inverts the signal of the node N14. In this manner, a waveform is generated for a signal in which the duty cycle is 50% by an inverter of a last stage and an inverter that is one stage prior to the last, and is output as signal RE_c to the node N15.

The same applies to signals /RE and /RE_c. That is, an inverter formed by the transistors 458 and 459 charges and discharges the capacitor element 468, and has the falling speed controlled by the variable current source 472. Then, an inverter formed by the transistors 460 and 461 charges and discharges the capacitor element 469, and has the rising speed controlled by the variable current source 473. In this manner, the duty cycle is corrected to 50%, a waveform is generated subsequently by the two stages of inverters, and the result is output as signal /RE_c.

3.3. Advantageous Effect of Third Embodiment

As the correction circuit 241 explained in the first embodiment, for example, the configuration explained in the present embodiment is applicable.

4. Fourth Embodiment

A semiconductor memory device according to a fourth embodiment will now be explained. The present embodiment relates to the ZQ calibration circuit 23 in the first embodiment, and applies the duty cycle correction operation explained in the first to third embodiments to the ZQ calibration operation. The following explanation will focus only on the points that differ from the first to third embodiments.

4.1. Configuration of ZQ Calibration Circuit

FIG. 18 is a block diagram of the ZQ calibration circuit 23. As shown in FIG. 18, the ZQ calibration circuit 23 comprises a pull-up circuit 231, a replica pull-up circuit 232, a pull-down circuit 233, a switching circuit 52, a comparator 62, a switching circuit 53, and a comparator 63.

The pull-up circuit 231 is supplied with VDD as a power supply voltage, and receives signal ZQcode_p from the sequencer 27. Signal ZQcode_p is, for example, a 5-bit digital signal. The pull-up circuit 231 changes the value of the output impedance thereof by the received signal ZQcode_p. The pull-up circuit 231 drives, that is, pulls up, a node N30 to the power supply voltage VDD based on the output impedance.

The ZQ calibration pad 33 is connected to the node N30. One end of the reference resistor 9 is connected to the ZQ calibration pad 33. The other end of the reference resistor 9 is grounded. Accordingly, signal ZQ_P that has a voltage determined by the relationship between the output impedance of the pull-up circuit 231 and the impedance of the reference resistor 9 is output to the node N30.

The switching circuit 52 connects the node N30 to a node N32 or a node N33, and connects a node N31 to the node N32 or the node N33 based on signal. SEL received from the sequencer 27. The matter on how to perform the connection will be described later. A reference voltage VREF is applied to the node N31. The reference voltage VREF is, for example, a voltage half the power supply voltage VDD.

The comparator 62 has a non-inverting input terminal connected to the node N32, and an inverting input terminal connected to the node N33. The comparator 62 compares the voltage of the node N32 and the voltage of the node N33, and outputs the comparison result from the output terminal to the sequencer 27 as signal FLGP.

The replica pull-up circuit 232 has a configuration and a function similar to those of the pull-up circuit 231. That is, the replica pull-up circuit 232 is supplied with VDD as a power supply voltage, and receives signal ZQcode_p from the sequencer 27. The output impedance thereof is set to a value based on signal ZQcode_p, and a node N34 is pulled up to the power supply voltage VDD. Since the replica pull-up circuit 232 and the pull-up circuit 231 set the output impedances based on the same signal. ZQcode_p, the output impedance of the replica pull-up circuit 232 and the output impedance of the pull-up circuit 231 are almost equal.

The pull-down circuit has a power source terminal thereof grounded, and receives signal ZQcode_n from the sequencer 27. The pull-down circuit sets the output impedance thereof to a value based on signal ZQcode_n, and drives, that is, pulls down, the node N34 to a ground voltage based on the set output impedance. Signal ZQcode_n is, for example, a 5-bit digital signal. As a result, signal ZQ_N that has a voltage based on the relationship between the output impedance of the replica pull-up circuit 232 and the output impedance of the pull-down circuit 233 is output to the node N34.

The switching circuit 53 connects the node N34 to a node N36 or a node N37, and connects a node N35 to the node N36 or the node N37 based on signal SEL received from the sequencer 27. The matter on how to perform the connection will be described later. Signal ZQ_N is applied to the node N34. The reference voltage VREF is applied to the node N35.

The comparator 63 has a non-inverting input terminal connected to the node N36, and an inverting input terminal connected to the node N37. The comparator 63 compares the voltage of the node N36 and the voltage of the node N37, and outputs the comparison result from the output terminal to the sequencer 27 as signal FLGN.

Furthermore, signals ZQcode_p and ZQcode_n transmitted by the sequencer 27 are also transmitted to the resistance control circuit 224 shown in FIG. 3 in addition to the pull-up circuit 231, the replica pull-up circuit 232, and the pull-down circuit 233 shown in FIG. 18.

Figure 20:
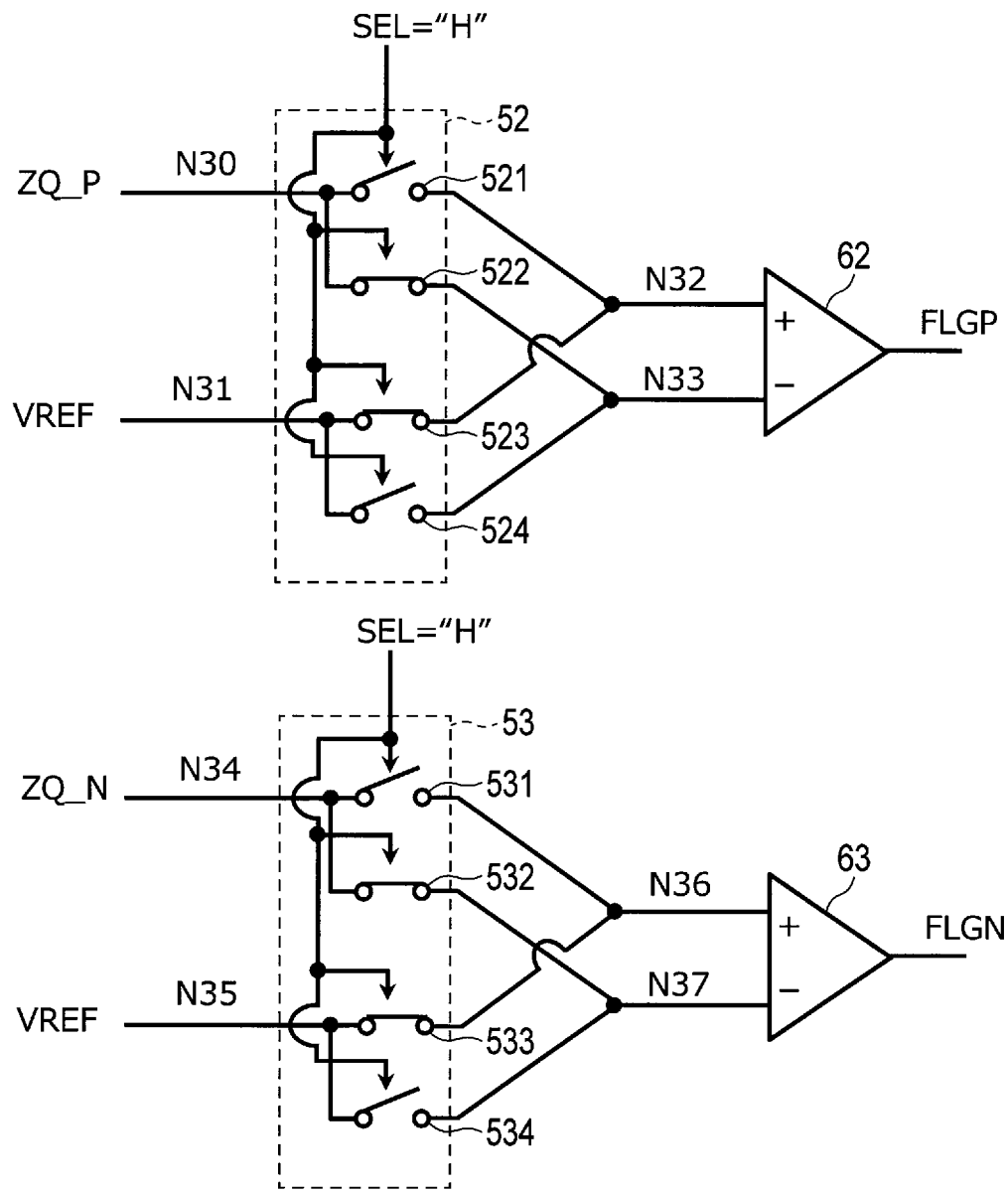
FIG. 20 is a circuit diagram showing an example of a circuit included in the ZQ calibration circuit provided in the semiconductor memory device according to the fourth embodiment.

Details of the method of switching connections in the above-mentioned switching circuits 52 and 53 will now be explained with reference to FIG. 19 and FIG. 20. FIG. 19 and FIG. 20 are circuit diagrams of a part of the area of the ZQ calibration circuit 23.

As shown in FIG. 19, the switching circuit 52 includes switches 521 to 524. The switching circuit 53 includes switches 531 to 534.

When signal SEL is, for example, an "L" level, the switch 521 connects the node N30 to the node N32, and transfers signal ZQ_P to the node N32. Such aspect is shown in FIG. 19. On the other hand, when signal SEL is an "H" level, the node N30 and the node N32 are disconnected. When signal SEL is, for example, an "H" level, the switch 522 connects the node N30 to the node N33, and transfers signal ZQ_P to the node N33. Such aspect is shown in FIG. 20. On the other hand, when signal SEL is an "L" level, the node N30 and the node N33 are disconnected.

When signal SEL is, for example, an "H" level, the switch 523 connects the node N31 to the node N32, and transfers the reference voltage VREF to the node N32. Such aspect is shown in FIG. 20. On the other hand, when signal SEL is an "L" level, the node N31 and the node N32 are disconnected. When signal SEL is an "L" level, the switch 524 connects the node N31 to the node N33, and transfers the reference voltage VREF to the node N33. Such aspect is shown in FIG. 19. On the other hand, when signal SEL is an "H" level, the node N31 and the node N33 are disconnected.

When signal SEL is, for example, an "L" level, the switch 531 connects the node N34 to the node N36, and transfers signal. ZQ_N to the node N36. Such aspect is shown in FIG. 19. On the other hand, when signal SEL is an "H" level, the node N34 and the node N36 are disconnected. When signal SEL is an "H" level, the switch 532 connects the node N34 to the node N37, and transfers signal ZQ_N to the node N37. Such aspect is shown in FIG. 20. On the other hand, when signal SEL is an "L" level, the node N34 and the node N37 are disconnected.

When signal SEL is, for example, an "H" level, the switch 533 connects the node N35 to the node N36, and transfers the reference voltage VREF to the node N36. Such aspect is shown in FIG. 20. On the other hand, when signal SEL is an "L" level, the node N35 and the node N36 are disconnected. When signal SEL is an "L" level, the switch 534 connects the node N35 to the node N37, and transfers the reference voltage VREF to the node N37. Such aspect is shown in FIG. 19. On the other hand, when signal SEL is an "H" level, the node N35 and the node N37 are disconnected.

A state in which signal SEL is an "L" level, and the node N30 and the node N32 are electrically connected, the node N31 and the node N33 are electrically connected, the node N34 and the node N36 are electrically connected, and the node N35 and the node N37 are electrically connected will be referred to as a "first connection". Furthermore, a state in which signal SEL is an "H" level, and the node N30 and the node N33 are electrically connected, the node N31 and the node N32 are electrically connected, the node. N34 and the node N37 are electrically connected, and the node N35 and the node N36 are electrically connected will be referred to as a "second connection".

4.2. Operation of ZQ Calibration Circuit

The ZQ calibration operation in the semiconductor memory device according to the fourth embodiment will be explained with reference to the flowchart shown in FIG. 21.

Figure 21:
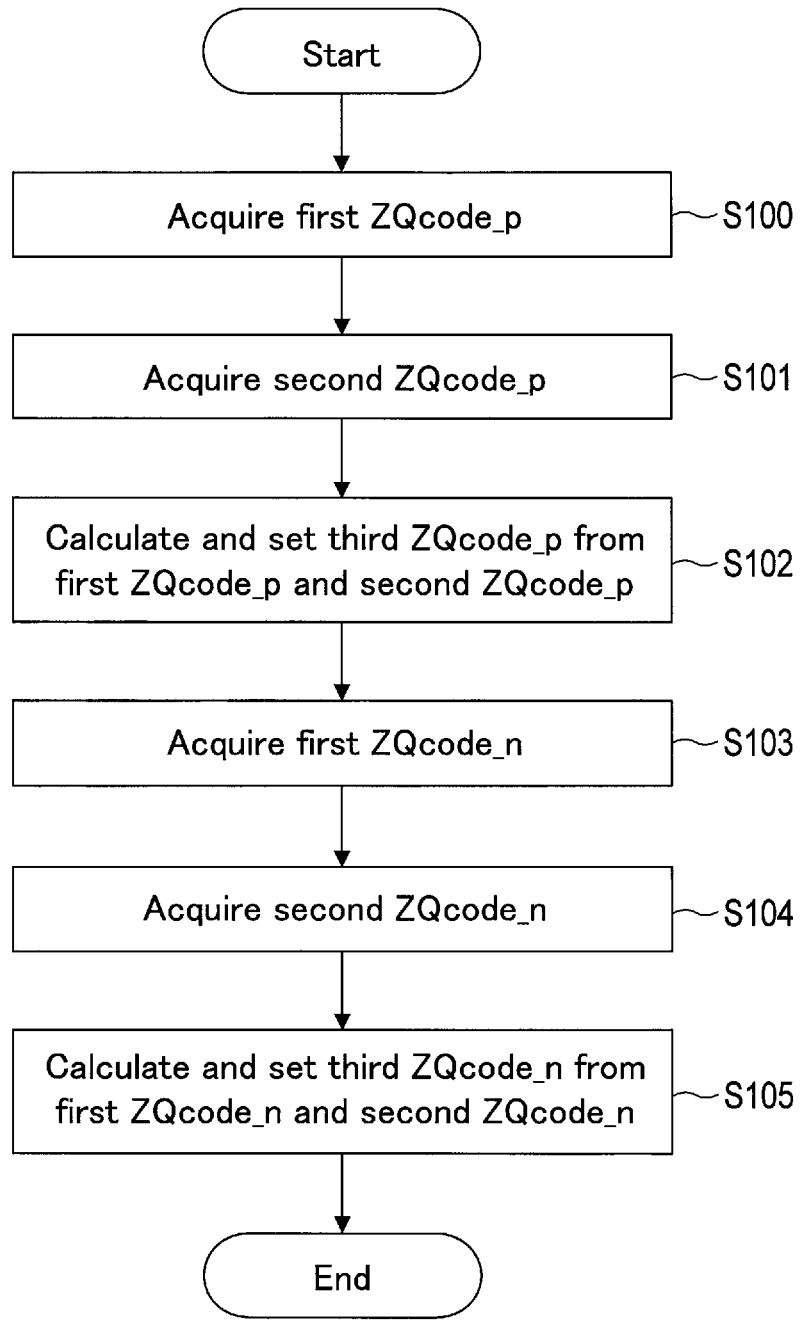
FIG. 21 is a flowchart showing an example of an operation of the ZQ calibration circuit provided in the semiconductor memory device according to the fourth embodiment.

As shown in FIG. 21, in step S100, in a state where the switching circuits 52 and 53 are set as the first connection, the sequencer 27 searches for ZQcode_p that makes the output impedance of the pull-up circuit 231 almost equal to the impedance of the reference resistor 9, and acquires it as a first ZQcode_p.

In step S101, in a state where the switching circuits 52 and 53 are set as the second connection, the sequencer 27 searches for ZQcode_p that makes the output impedance of the pull-up circuit 231 almost equal to the impedance of the reference resistor 9, and acquires it as a second ZQcode_p.

In step S102, the sequencer 27 calculates a third ZQcode_p from the first ZQcode_p and the second ZQcode_p. The calculation method is, for example, a center value of the first ZQcode_p and the second ZQcode_p. Alternatively, in the case where the calculation result includes a fraction, the correction code may be rounded up, or may be rounded down. The sequencer 27 sets the third ZQcode_p for the pull-up circuit 231, the replica pull-up circuit 232, and the resistance control circuit 224.

In step S103, in a state where the switching circuits 52 and 53 are set as the first connection, the sequencer 27 searches for ZQcode_n that makes the output impedance of the pull-down circuit 233 almost equal to the output impedance of the replica pull-up circuit 232, and acquires it as a first ZQcode_n.

In step S104, in a state where the switching circuits 52 and 53 are set as the second connection, the sequencer 27 searches for ZQcode_n that makes the output impedance of the pull-down circuit 233 almost equal to the output impedance of the replica pull-up circuit 232, and acquires it as a second ZQcode_n.

In step S105, the sequencer 27 calculates a third ZQcode_n from the first ZQcode_n and the second ZQcode_n. The calculation method is the same as the third ZQcode_p. The sequencer 27 sets the third ZQcode_n for the pull-down circuit 233 and the resistance control circuit 224. The ZQ calibration operation is thus ended.

4.3. Advantageous Effect of Fourth Embodiment

According to the fourth embodiment, in the ZQ calibration operation, the influence caused by the offset of the comparator can be reduced, and operation reliability of the semiconductor memory device can be improved. The advantageous effect will be explained below.

The ZQ calibration operation is an operation for calibrating an output impedance of the output circuit to a desired value. The semiconductor memory device 5, for example, transmits signal DQS to the controller 2. At this time, when the output impedance of the circuit driving the signal is deviated from the impedance of a transmission line, the mismatch of the impedance causes the signal to reflect, thereby deteriorating the signal quality. Furthermore, characteristics of a circuit from which the signal is output may vary. Accordingly, the parameter of an output circuit is required to be set so that a desired output impedance is obtained. The present embodiment uses a ZQ calibration circuit having the same circuit configuration as the output circuit that outputs the signal. By searching for the parameter at the ZQ calibration circuit and applying it to the output circuit having the same circuit configuration, the output impedance of the output circuit can be calibrated.

In the ZQ calibration circuit 23, the pull-up circuit 231 of which the impedance is settable by ZQcode_p pulls up the node N30 via the reference resistor 9 of which the impedance is a known value. By comparing signal ZQ_P output to the node N30 and the reference voltage VREF, and searching for signal ZQcode_p that makes signal ZQ_P almost equal to the reference voltage VREF, the output impedance of the pull-up circuit 231 can be calibrated.

For example, if the reference voltage VREF has a voltage that is half the power supply voltage VDD, by searching for signal ZQcode_p that makes signal ZQ_P almost equal to the reference voltage VREF, the output impedance of the pull-up circuit 231 can be made almost equal to the impedance of the reference resistor 9.

The replica pull-up circuit 232 has a configuration similar to that of the pull-up circuit 231. Accordingly, by applying ZQcode_p obtained by calibrating the pull-up circuit 231 to the replica pull-up circuit 232, the output impedance of the replica pull-up circuit 232 can be made almost equal to the impedance of the reference resistor 9.

The pull-down circuit 233 pulls down the node N34 that is the output node of the replica pull-up circuit 232. By comparing signal ZQ_N output to the node N34 and the reference voltage VREF, and searching for signal ZQcode_n that makes signal ZQ_N almost equal to the reference voltage VREF, the output impedance of the pull-down circuit 233 can be calibrated.

For example, if the reference voltage VREF has a voltage that is half the power supply voltage VDD, by searching for signal ZQcode_n that makes signal ZQ_N almost equal to the reference voltage VREF, the output impedance of the pull-down circuit 233 can be made almost equal to the output impedance of the replica pull-up circuit 232. That is, the output impedance of the pull-down circuit 233 can be made almost equal to the impedance of the reference resistor 9.

In this manner, the sequencer 27 searches for the correction code by using signal FLGP that is the output of the comparator 62 and signal FLGN that is the output of the comparator 63. However, as explained in the first embodiment, determination threshold values vary in the comparator. The variations can be equivalently expressed by an ideal comparator that does not vary, and a voltage source connected to an input terminal. An example of a case in which an input offset voltage of the comparator 62 is an input offset voltage Voffp, and an input offset voltage of the comparator 63 is an input offset voltage Voffn contribute to an inverting input terminal will be explained.

Figure 22:
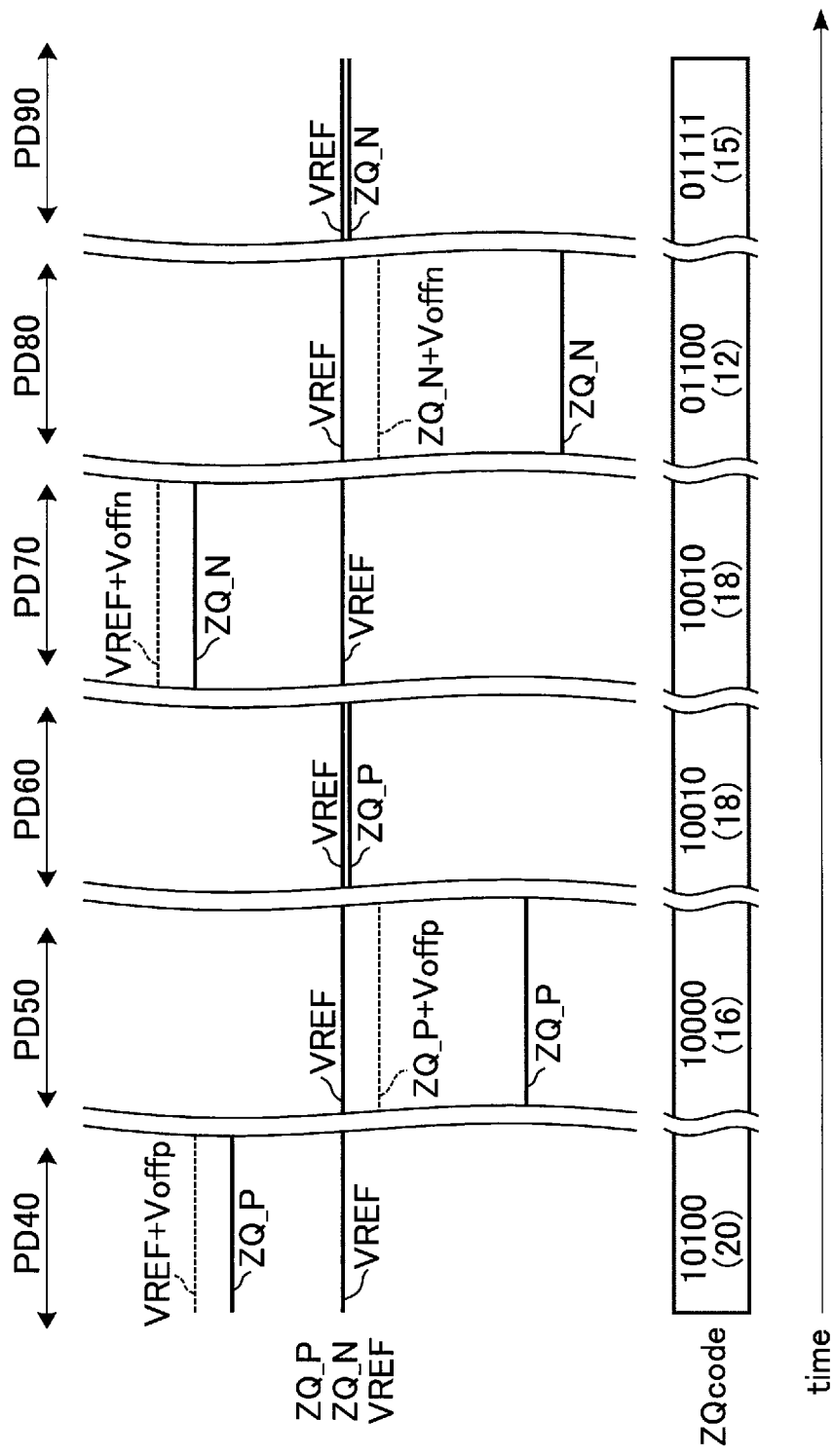
FIG. 22 is a diagram showing an example of an operation of the ZQ calibration circuit provided in the semiconductor memory device according to the fourth embodiment.

FIG. 22 is a diagram expressing various signal voltages and correction codes regarding the ZQ calibration operation. In the example of FIG. 22, ZQcode_p and ZQcode_n, which are correction codes, are 5-bit signals, and decimal notations are added in parenthesis to bit strings. Furthermore, in the example of FIG. 22, a case in which input offset voltages Voffp and Voffn are both positive, and Voffn is larger than Voffp is shown. Period PD40 corresponds to a state in which the first ZQcode_p is determined in step S100 of FIG. 21. Period PD50 corresponds to a state in which the second ZQcode_p is determined in step S101 of FIG. 21. Period PD60 corresponds to a state in which the third ZQcode_p is determined in step S102 of FIG. 21. Period PD70 corresponds to a state in which the first ZQcode_n is determined in step S103 of FIG. 21. Period PD80 corresponds to a state in which the second ZQcode_n is determined in step S104 of FIG. 21. Period PD90 corresponds to a state in which the third ZQcode_n is determined in step S105 of FIG. 21.

In period PD40, the switching circuits 52 and 53 are set as the first connection. That is, the reference voltage VREF to be applied to the inverting input terminal of the comparator 62 may be regarded as being influenced by the input offset voltage Voffp. A voltage obtained by adding the input offset voltage Voffp to the reference voltage VREF is shown by a broken line. As a result, as the first ZQcode_p, for example, a bit string "10100" in which signal ZQ_P becomes larger than the reference voltage VREF is determined. In decimal notation, this is "20".

In contrast, in period PD50, the switching circuits 52 and 53 are set as the second connection. That is, signal ZQ_P to be applied to the inverting input terminal of the comparator 62 may be regarded as being influenced by the input offset voltage Voffp. A voltage obtained by adding the input offset voltage Voffp to signal ZQ_P is shown by a broken line. As a result, as the second ZQcode_p, for example, a bit string "10000" in which signal ZQ_P becomes smaller than the reference voltage VREF is determined. In decimal notation, this is "16".

In period PD60, a bit string "10010" is calculated as the third ZQcode_p from the first ZQcode_p and the second ZQcode_p. In decimal notation, this is "18". In this manner, by calculating the third ZQcode_p from the first ZQcode_p and the second ZQcode_p, the influence of the input offset voltage Voffp can be canceled, and the influence of the voltage Voffp on the correction code can be suppressed. As a result, signal ZQ_P becomes almost equal to the reference voltage VREF.

Similarly, also for signal ZQ_N, the influence of the input offset voltage Voffn can be canceled, and the influence of the voltage Voffn on the correction code can be suppressed. As a result, signal ZQ_N becomes almost equal to the reference voltage VREF.

As a result of the above, the semiconductor memory device 5 is capable of executing the ZQ calibration operation while suppressing the influence from the offset of the comparator, and is capable of improving operation reliability of the semiconductor memory device 5.

5. Fifth Embodiment

A semiconductor memory device according to a fifth embodiment will now be explained. The present embodiment relates to details on an acquisition method of the correction code explained with reference to FIG. 22 in the above-mentioned fourth embodiment. Hereinafter, explanations on parts that are similar to those of the fourth embodiment will be omitted.

5.1. First ZQcode_p Acquisition Operation

First of all, a first ZQcode_p acquisition regarding the ZQ calibration operation of the semiconductor memory device according to the fifth embodiment will be explained. FIG. 23 is a flowchart corresponding to step S100 of FIG. 21 explained in the fourth embodiment.

As shown in FIG. 23, in step S120, the sequencer 27 has the switching circuit set as the first connection. Therefore, signal ZQ_P is applied to the non-inverting input terminal of the comparator 62. Similarly, the reference voltage VREF is applied to the inverting input terminal of the comparator 62.

In step S121, the sequencer 27 initializes correction code ZQcode_p. In the following, correction code ZQcode_p is 5 bits, and the initialized bit string is "00000".

In step S122, the sequencer 27 initializes variable "j" for designating a bit to refer to among the correction codes which are signals of a plurality of bits. The initialized variable "j" is, for example, "0".

Subsequently, in step S123, the sequencer 27 sets a value of the bit to be designated by the variable j among a plurality of bits (N bits) of correction code ZQcode_p to a predetermined value. In the case of the present example, since ZQcode_p is 5 bits, N="5", and variable j="0". Furthermore, the sequencer substitutes "1" in the (N−j)th digit. That is, in the initialized correction code ZQcode_p="00000", by setting "1" to the (5−0)="5"th digit, that is, the most significant bit, correction code ZQcode_p is updated to "10000". A variety of methods can be used for this update, and the present method is merely an example. By updating correction code ZQcode_p, the output impedance of the pull-up circuit 231 changes, and signal ZQ_P changes.

Next, in step S124, the sequencer 27 determines whether or not the voltage of signal ZQ_P is smaller than the reference voltage VREF based on signal FLGP. In the case where FLGP="H" (step S124, No), that is, signal ZQ_P is determined as being larger than the reference voltage VREF, step S125 is executed.

In step S125, the sequencer 27 substitutes zero in the "N −j"th digit of ZQcode_p. For example, in the case where ZQcode_p is "11000", N=5, and j=1, zero is substituted in the fourth digit, and ZQcode_p becomes "10000". The sequencer 27 then executes step S126.

In step S124, in the case where FLGP="L" (step S124, Yes), that is, in the case where the sequencer 27 determines that signal ZQ_P is smaller than VREF, the sequencer 27 executes step S126.

In step S126, the sequencer 27 determines whether or not variable "j" is smaller than the number of digits "N". That is, the sequencer 27 increments variable "j" and determines whether or not a digit that can be referred to remains. In the case where j<N (step S126, Yes), the sequencer 27 executes step S127.

In step S127, the sequencer 27 increments variable "j". In step S128, the sequencer 27 substitutes one in the "N −j"th digit of ZQcode_p. For example, in the case where ZQcode_p is "10000", N=5, and j=1, one is substituted in the fourth digit, and ZQcode_p is updated as "11000". The sequencer 27 then repeats operations thereafter step S124.

In this manner, the sequencer 27 repeats steps S124 to S126. That is, "1" is substituted in each bit to compare signal ZQ_P and the reference voltage VREF. If signal ZQ_P is larger than the reference voltage VREF, "0" is substituted in the referred bit, and if the reference voltage VREF is larger than signal ZQ_P, the value of the referred bit is maintained.

In step S126, in the case where j≥N (step S126, No), that is, in the case where variable "j" is incremented until all of the bits are referred to, the sequencer 27 executes step S129.

In step S129, the sequencer 27 acquires ZQcode_p as the first ZQcode_p. Accordingly, the first ZQcode_p acquisition operation is ended.

5.2. Second ZQcode_p Acquisition Operation

Figure 24:
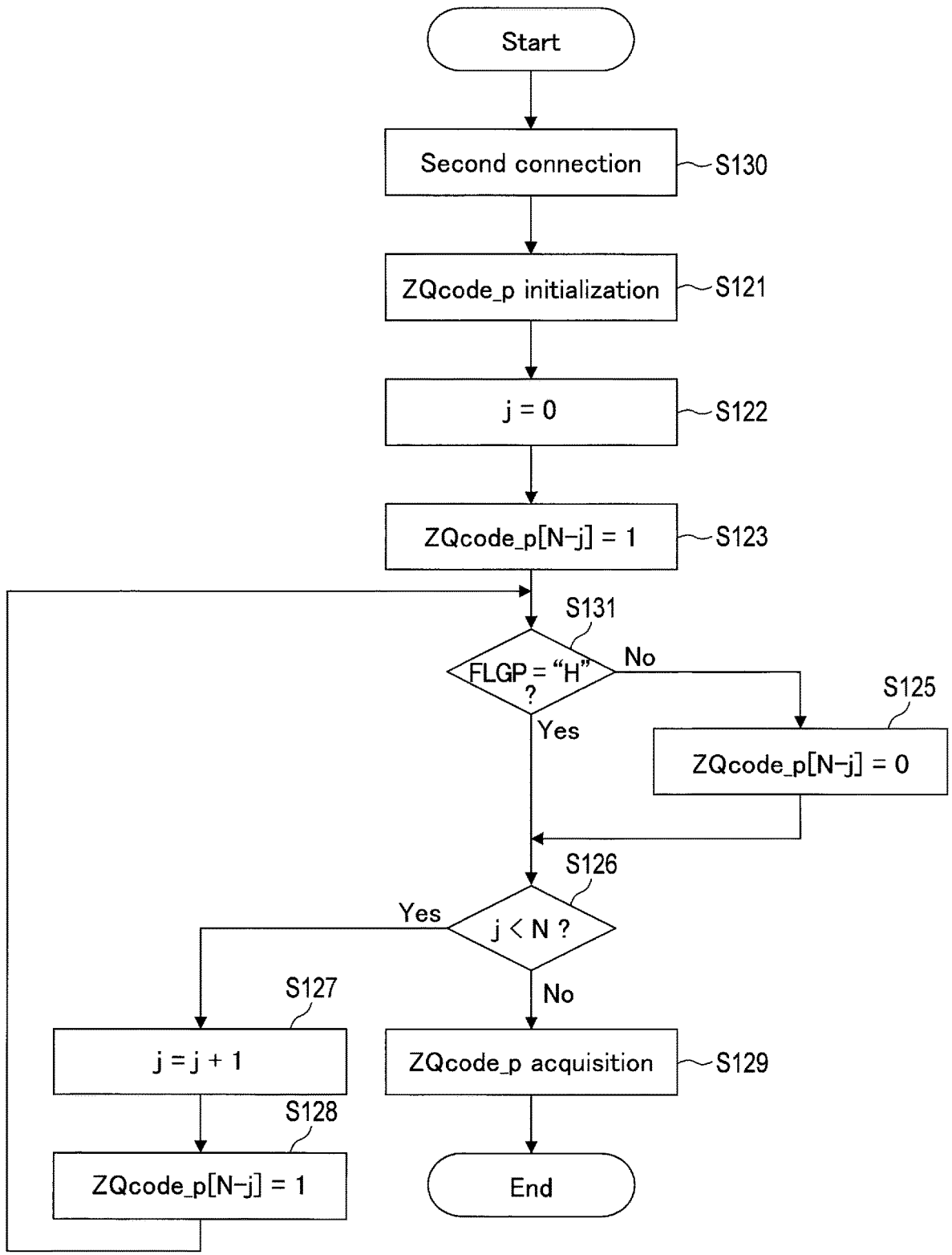
FIG. 24 is a flowchart showing an example of an operation of the ZQ calibration circuit provided in the semiconductor memory device according to the fifth embodiment.

A second ZQcode_p acquisition will now be explained. FIG. 24 is a flowchart corresponding to step S101 of FIG. 21 explained in the fourth embodiment. As illustrated, the second ZQcode_p acquisition operation is obtained by changing step S120 to the later described step S130, and changing step S124 to the later described step S131 in the first. ZQcode_p acquisition operation explained in FIG. 23. The rest of the steps are the same as FIG. 23.

In step S130, the sequencer 27 has the switching circuit set as the second connection. Therefore, the reference voltage VREF is applied to the non-inverting input terminal of the comparator 62. Similarly, signal ZQ_P is applied to the inverting input terminal of the comparator 62.

In step S131, the sequencer 27 determines whether or not signal ZQ_P is larger than the reference voltage VREF based on signal FLGP. In the case where FLGP="H" (step S131, Yes), that is, signal ZQ_P is determined as being smaller than the reference voltage VREF, step S126 is executed. On the other hand, in step S131, in the case where FLGP="L" (step S131, No), that is, the sequencer 27 determines that signal ZQ_P is larger than the reference voltage VREF, step S125 is executed.

That is, in the second ZQcode_p acquisition operation, since the switching circuit is set as the second connection, the relationship of magnitude between signal ZQ_P and the reference voltage VREF, and the relationship of outputting an "H" level or an "L" level of signal FLOP are reversed with respect the first ZQcode_p acquisition operation.

5.3. First and Second ZQcode_n Acquisition Operations

First and second ZQcode_n acquisition operations that correspond to steps S103 and S104 of FIG. 21 explained in the fourth embodiment are also similar to the first and second ZQcode_p acquisition operations.

5.4. Advantageous Effect of Fifth Embodiment

In the manner mentioned above, the first and second ZQcode_p acquisition operations and the first and second ZQcode_n acquisition operations explained in the fourth embodiment can be executed using, for example, the method explained in the present embodiment.

6. Sixth Embodiment

A semiconductor memory device according to a sixth embodiment will now be explained. The present embodiment uses parameters obtained by the ZQ calibration circuit 23 explained in the fourth embodiment to control a transistor that generates signal DQS in the input/output circuit 22. Hereinafter, explanations on parts that are similar to those of the first embodiment and the fourth embodiment will be omitted. In the sixth embodiment, an example of a case in which correction codes ZQcode_p and ZQcode_n are 5 bits will be explained.

6.1. Configuration of ZQ Calibration Circuit

A pull-up circuit 231, a replica pull-up circuit 232, and a pull-down circuit 233 in a ZQ calibration circuit 23 according to the present embodiment will first be explained.

Figure 25:
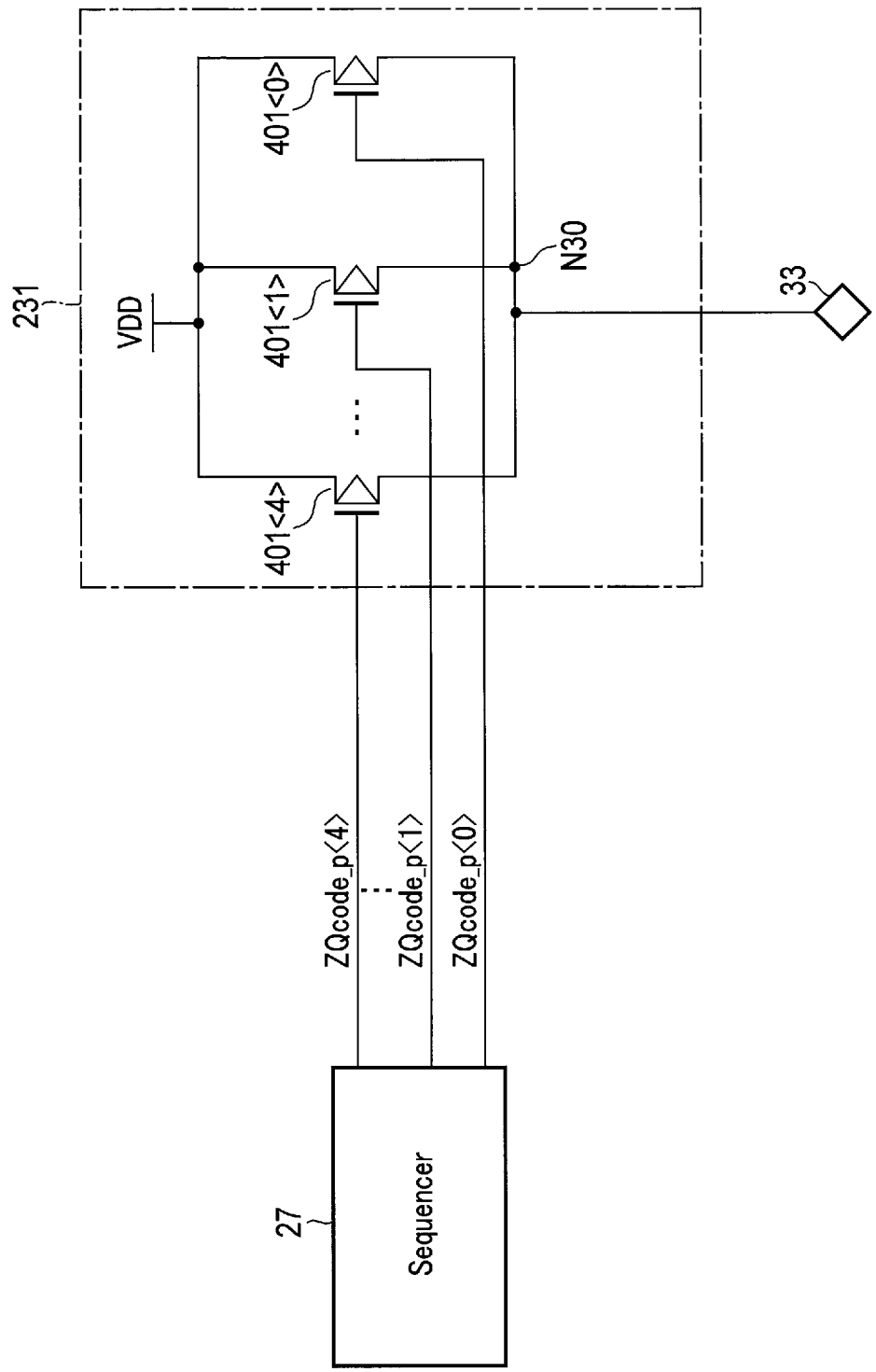
FIG. 25 is a circuit diagram showing an example of a pull-up circuit provided in a semiconductor memory device according to a sixth embodiment.

FIG. 25 is a circuit diagram of the pull-up circuit 231 according to the present example. As illustrated, the pull-up circuit 231 according to the present example comprises five p-channel MOS transistors 401 <4:0>. In the transistors 401 <4:0>, a power supply voltage VDD is applied to the sources, and the drains are connected to the node N30. The sequencer 27 applies signals ZQcode_p <4:0> to the gates of the transistors 401 <4:0>. Each of the transistors 401 <4:0> has a current drivability corresponding to the bit of the signal applied to the gate. For example, the size of a transistor 401 <m> doubles the size of a transistor 401 <m−1>. Here, m is an integer of one to four.

By the above configuration, in the pull-up circuit 231, transistors that are selected by signals ZQcode_p <4:0> are turned on. That is, the node N30 is driven to the power supply voltage VDD by an output impedance based on signals ZQcode_p <4:0>.

Figure 26:
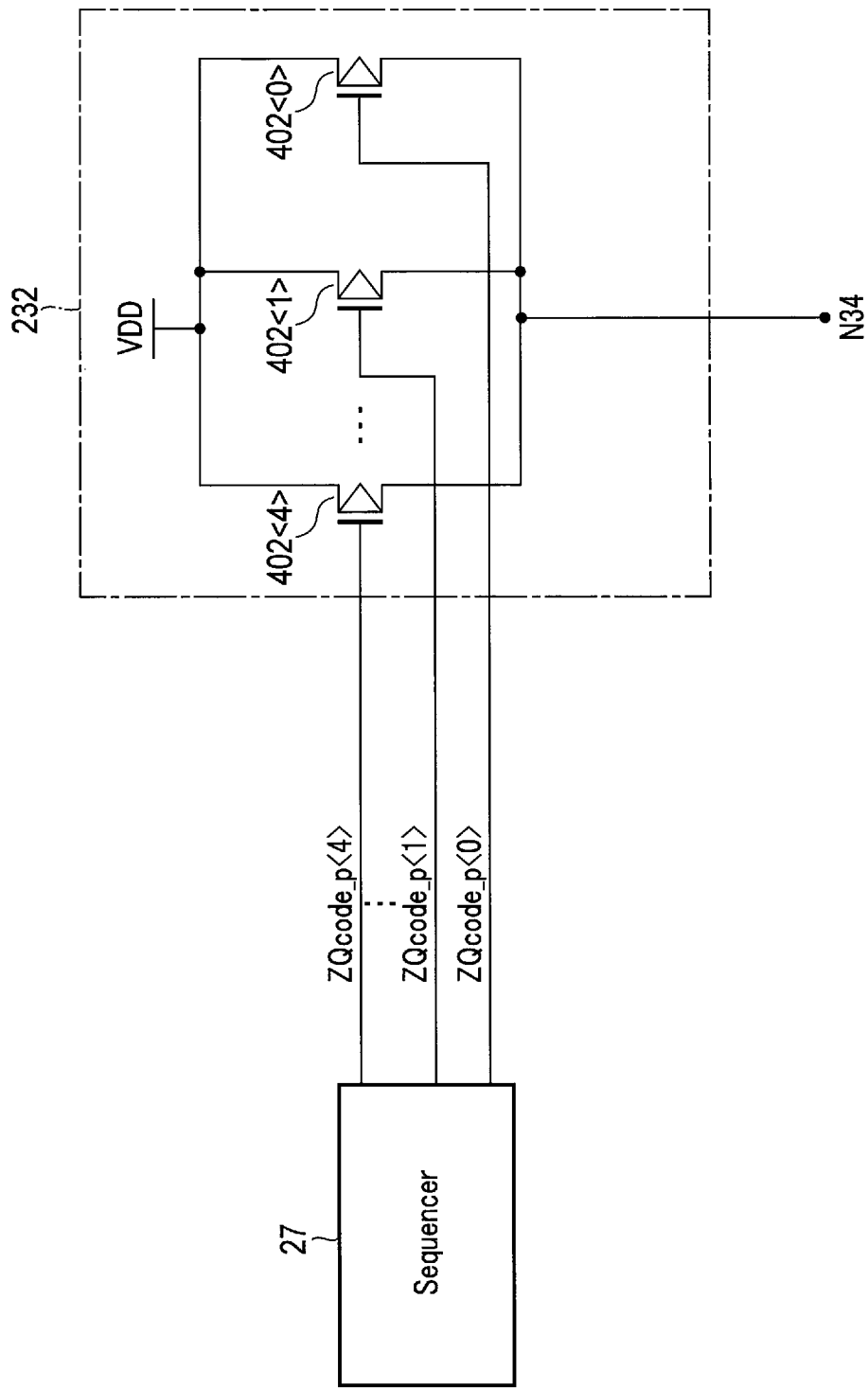
FIG. 26 is a circuit diagram showing an example of a replica pull-up circuit provided in the semiconductor memory device according to the sixth embodiment.

FIG. 26 is a circuit diagram of the replica pull-up circuit 232 according to the present example. As illustrated, the replica pull-up circuit 232 according to the present example comprises five p-channel MOS transistors 402 <4:0>. In the transistors 402 <4:0>, a power supply voltage VDD is applied to the sources, and the drains are connected to the node N34. The sequencer 27 applies signals ZQcode_p <4:0> to the gates of the transistors 402 <4:0>. The replica pull-up circuit 232 has a configuration similar to that of the pull-up circuit 231.

By the above configuration, in the replica pull-up circuit 232, the node N34 is driven to the power supply voltage VDD by an output impedance equal to the pull-up circuit 231.

Figure 27:
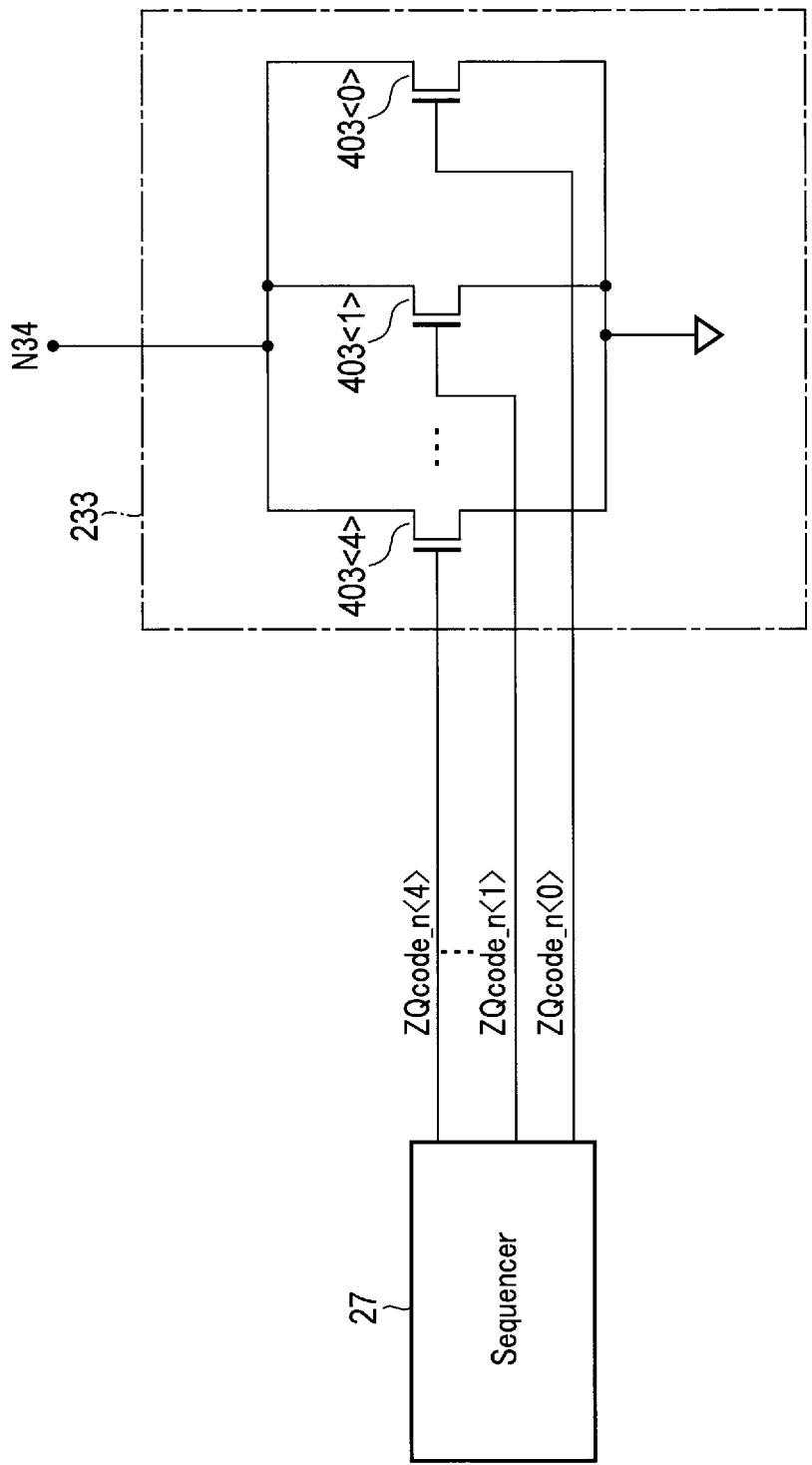
FIG. 27 is a circuit diagram showing an example of a pull-down circuit provided in the semiconductor memory device according to the sixth embodiment.

FIG. 27 is a circuit diagram of the pull-down circuit 233 according to the present example. As illustrated, the pull-down circuit 233 according to the present example comprises five n-channel MOS transistors 403 <4:0>. In the transistors 403 <4:0>, the sources are grounded, and the drains are connected to the node N34. The sequencer 27 applies signals ZQcode_n <4:0> to the gates of the transistors 403 <4:0>. Each of the transistors 403 <4:0> has a current drivability corresponding to the bit of the signal applied to the gate. For example, the size of a transistor 403 <m> doubles the size of a transistor 403 <m−1>. Here, m is an integer of one to four.

By the above configuration, in the pull-down circuit 233, transistors that are selected by signals ZQcode_n <4:0> are turned on. That is, the node N34 is driven to the ground voltage GNB by an output impedance based on signals ZQcode_n <4:0>.

6.2. Configuration of Circuit Included in Input/Output Circuit

Figure 28:
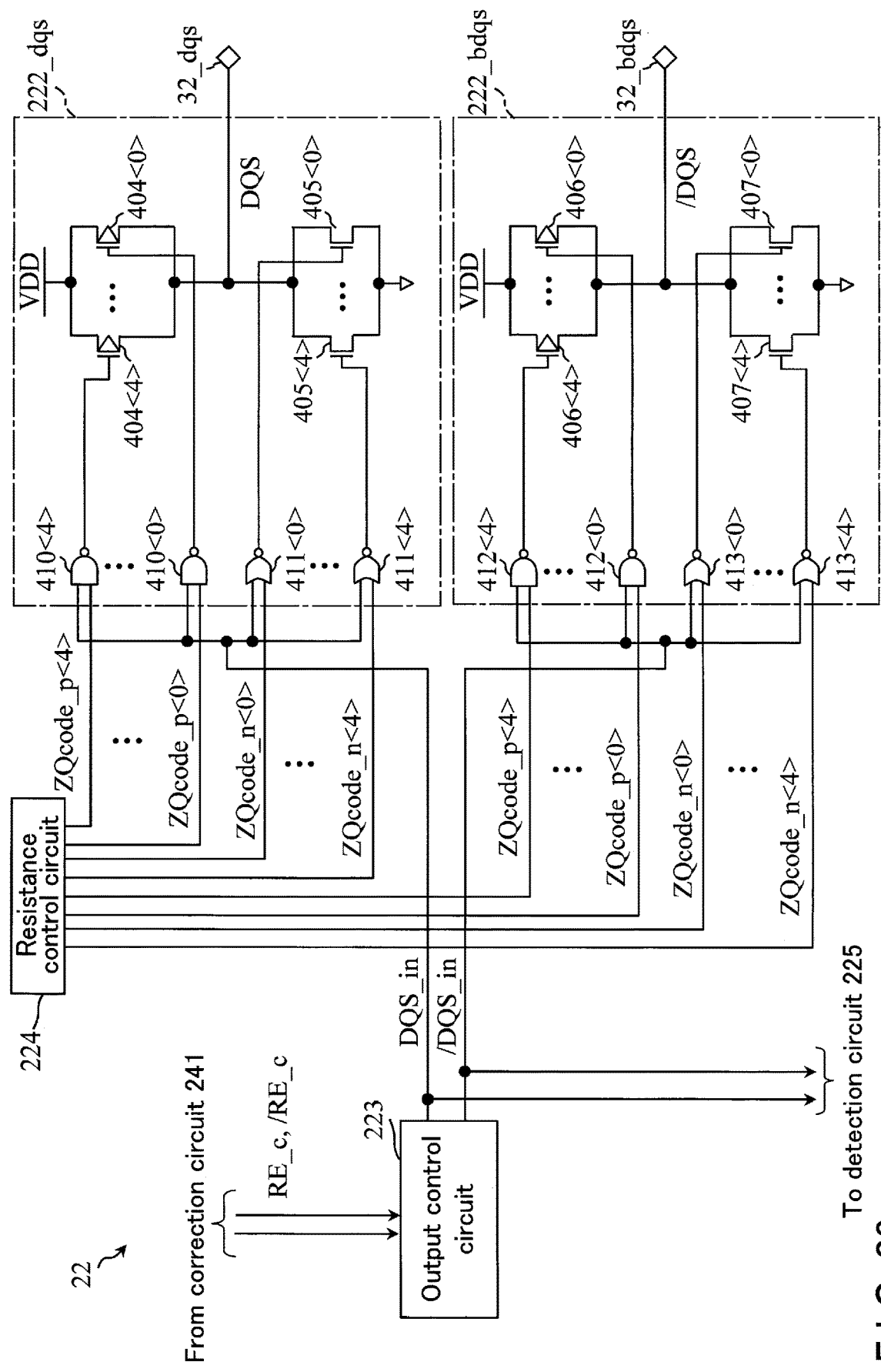
FIG. 28 is a circuit diagram showing an example of an input/output circuit provided in the semiconductor memory device according to the sixth embodiment.

An input/output circuit 22 according to the present embodiment will now be explained. FIG. 28 is a circuit diagram showing a part of the area of the input/output circuit 22 according to the present example.

First of all, an output circuit 222_dqs will be explained. As shown in FIG. 28, the output circuit 222_dqs comprises five p-channel MOS transistors 404 <4:0>, five re-channel MOS transistors 405 <4:0>, five NAND gates 410 <4:0>, and five NOR gates 411 <4:0>.

The transistors 404 <4:0> have configurations similar to that of the pull-up circuit 231, and transistors 405 <4:0> have configurations similar to that of the pull-down circuit 233. That is, in the transistors 404 <4:0>, a power supply voltage VDD is applied to the sources, and the drains are connected to a pad 32_dqs. In the transistors 405 <4:0>, the sources are grounded, and the drains are connected to the pad 32_dqs.

Furthermore, the NAND gates 410 <4:0> perform a NAND operation of signal DQS_in and signals ZQcode_p <4:0>, and apply the results to the gates of the transistors 404 <4:0> as signals of an "L" level or an "H" level. The NOR gates 411 <4:0> perform a NOR operation of signal DQS_in and signals ZQcode_n <4:0>, and apply the results to the gates of the transistors 405 <4:0> as signals of an "L" level or an "H" level.

By the above configuration, in the output circuit 222_dqs, in the case where signal DQS_in is an "H" level, the transistor selected by signals ZQcode_p <4:0> among the transistors 404 <4:0> is turned on, and the voltage of the pad

32_dqs is driven to the VDD. Furthermore, in the output circuit 222_dqs, in the case where signal DQS_in is an "L" level, the transistor selected by signals ZQcode_n <4:0> among the transistors 405 <4:0> is turned on, and the voltage of the pad 32_dqs is driven to the ground voltage GND. That is, the output circuit 222_dqs outputs signal DQS from the pad 32_dqs based on the output impedance set by signals ZQcode_p and ZQcode_n.

Next, an output circuit 222_bdqs will be explained. Similarly, as shown in FIG. 28, the output circuit 222_bdqs comprises five p-channel MOS transistors 406 <4:0>, five n-channel MOS transistors 407 <4:0>, five NAND gates 412 <4:0>, and five NOR gates 413 <4:0>.

The transistors 406 <4:0> have configurations similar to that of the pull-up circuit 231, and transistors 407 <4:0> have configurations similar to that of the pull-down circuit 233. In the transistors 406 <4:0>, a power supply voltage VDD is applied to the sources, and the drains are connected to a pad 32_bdqs. In the transistors 407 <4:0>, the sources are grounded, and the drains are connected to the pad 32_bdqs.

Furthermore, the NAND gates 412 <4:0> perform a NAND operation of signal /DQS_in and signals ZQcode_p <4:0>, and apply the results to the gates of the transistors 406 <4:0> as signals of an "L" level or an "H" level. The NOR gates 413 <4:0> perform a NOR operation of signal /DQS_in and signals ZQcode_n <4:0>, and apply the results to the gates of the transistors 407 <4:0> as signals of an "L" level or an "H" level.

By the above configuration, in the output circuit 222_bdqs, in the case where signal /DQS_in is an "H" level, the transistor selected by signals ZQcode_p <4:0> among the transistors 406 <4:0> is turned on, and the voltage of the pad 32_bdqs is driven to the VDD. Furthermore, in the output circuit 222_bdqs, in the case where signal /DQS_in is an "L" level, the transistor selected by signals ZQcode_n <4:0> among the transistors 407 <4:0> is turned on, and the voltage of the pad 32_bdqs is driven to the ground voltage GND. That is, the output circuit 222_bdqs outputs signal /DQS from the pad 32_bdqs by the output impedance set by signals ZQcode_p and ZQcode_n.

6.3. Advantageous Effect of Sixth Embodiment

As the ZQ calibration circuit 23 explained in the fourth embodiment and the input/output circuit 22 explained in the first embodiment, for example, the configuration explained in the present embodiment is applicable. In the configuration according to the present embodiment, by applying the correction code obtained by the ZQ calibration circuit 23 to the output circuit, the quality of the signal output by the semiconductor memory device 5 can be improved, and the operation reliability of the semiconductor memory device 5 can be improved.

7. Modified Example, Etc

Embodiments are not limited to those mentioned in the above first to sixth embodiments, and can be modified in various forms. For example, various modifications can be applied to the method in which the sequencer 27 searches for a setting value based on an output of a comparator that is explained in detail in the second embodiment to the fourth embodiment. For example, when searching for the setting value in the duty cycle correction circuit, a method of using a correction code of a plurality of bits to determine the value in sequence from an upper bit may be used. Furthermore, when searching for the setting value in the ZQ calibration circuit, a method of incrementing or decrementing the correction code may also be used. The embodiments are not limited to the duty cycle correction and the ZQ calibration, and may be applied to a system where the correction value is searched for by using a comparator.

Furthermore, the execution timing of the duty cycle correction and the ZQ calibration is not limited to when turning on the power of the semiconductor memory device 5 that is explained in FIG. 7 of the first embodiment. For example, the timing may also be when receiving an execution command of the duty cycle correction operation or the ZQ calibration operation from the controller 2.

Various modifications are also possible for the semiconductor memory device presented in the fourth embodiment. In the example presented in the fourth embodiment, each of the pull-up circuit 231 and the replica pull-up circuit 232 receives signal ZQcode_p from the sequencer 27. For example, the pull-up circuit 231 may receive signal ZQcode_p1 from the sequencer 27, and the replica pull-up circuit 232 may receive signal ZQcode_p2 that is different from signal ZQcode_p1 from the sequencer 27. Furthermore, the impedance of the reference resistor 9 and the output impedance of each of the pull-up circuit 231, the replica pull-up circuit 232, and the pull-down circuit 233 do not have to be approximately the same value. For example, the impedance of the reference resistor 9 may be 300Ω, the output impedance of the pull-up circuit 231 may be 300Ω, the output impedance of the replica pull-up circuit 232 may be 100Ω smaller than 300Ω, and the output impedance of the pull-down circuit 233 may be 100Ω smaller than 300Ω.

Figure 29:
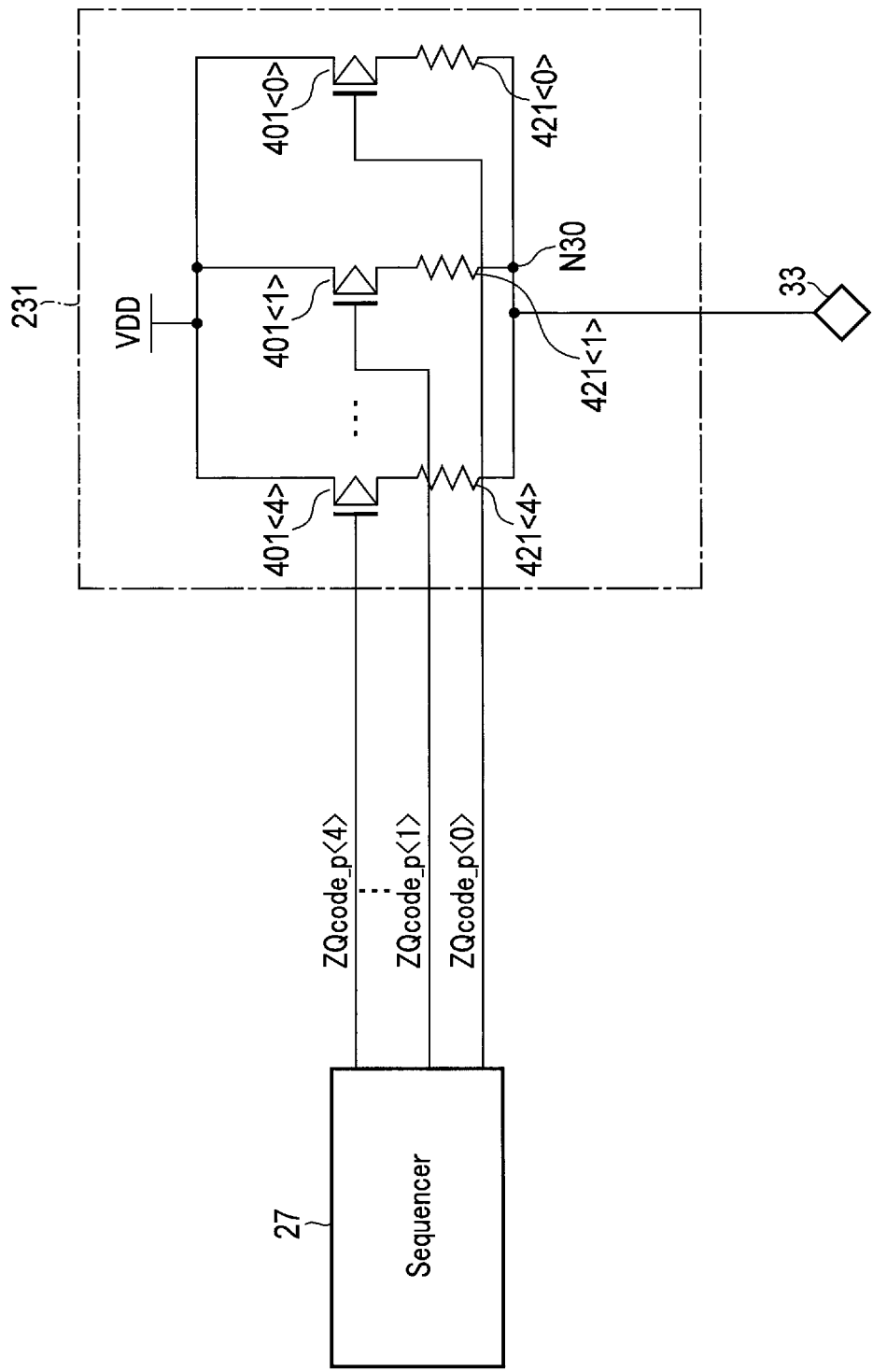
FIG. 29 is a circuit diagram showing a modified example of the pull-up circuit provided in the semiconductor memory device according to the sixth embodiment.

Various modifications are also possible for the pull-up circuit 231, the replica pull-up circuit 232, and the pull-down circuit 233 presented in the sixth embodiment. FIG. 29 is a circuit diagram showing a modified example of the pull-up circuit 231. For example, as shown in FIG. 29, resistors 421 <4:0> are each provided between a drain of each of the transistors 401 <4:0> and a node 33 in the pull-up circuit 231. Furthermore, for example, the size of a transistor 401 <n> may be twice the size of a transistor 401 <n−1>, and the resistance value of a resistor 421 <n> may be half that of a resistor 421 <n−1>. As a method of setting the relationship of the resistance value to ½, for example, the resistor 421 <n> may be configured by connecting resistance elements having the same resistance value as the resistance 421 <n−1> in parallel. However, n is an integer of one to four. The same modification as the pull-up circuit 231 is also possible for the replica pull-up circuit 232 and the pull-down circuit 233. The same modification is also possible for each of the output circuits 222 <7:0>, 222_dqs, and 222_bdqs included in the input/output circuit 22.

An example of the ZQ calibration operation regarding the output impedance has been explained for the semiconductor memory device presented in the fourth to sixth embodiments; however, the operation is not limited thereto. For example, in the semiconductor memory device presented in the fourth to sixth embodiments, an impedance of a termination resistance can be adjusted.

The termination resistance is provided to, for example, each of the input circuits 221 <7:0>, 221_dqs, and 221_bdqs to prevent signal reflection and secure signal quality. The termination resistance is provided between a signal line and, for example, a node to which a termination voltage is applied, and is electrically connected between the signal line and the node by a certain impedance. A termination resistance circuit operates as the termination resistance that is capable of adjusting the impedance. The termination resistance circuit receives a signal from the sequencer 27, and is capable of adjusting the impedance based on the signal in order to suppress influence caused by variability in the process.

The examples presented in the fourth to the sixth embodiments can be applied to the adjustment of the termination resistance. That is, the termination resistance circuit may be configured by using a circuit configuration similar to at least one of the pull-up circuit 231, the replica pull-up circuit 232, and the pull-down circuit 233. For example, each of the input circuits 221 <7:0>, 221_dqs, and 221_bdqs may include the termination resistance circuit including a plurality of transistors and a plurality of resistors, and adjust the termination resistance based on the correction code received from the sequencer 27. Furthermore, the sequencer 27 may generate the correction code to be applied to the termination resistance circuit based on the correction code used in the ZQ calibration circuit 23.

A plurality of modified examples explained above may also be combined. For example, in the input/output circuit 22, each of the output circuits 222 <7:0>, 222_dqs, and 222_bdqs may include a plurality of transistors and a resistance element to adjust each of the output impedances. Furthermore, in the input/output circuit 22, each of the input circuits 221 <7:0>, 221_dqs, and 221_bdqs may include the termination resistance circuit including a plurality of transistors and a plurality of resistors to adjust the termination resistance. Furthermore, in the ZQ calibration circuit 23, each of the pull-up circuit 231, the replica pull-up circuit 232, and the pull-down circuit 233 may include a plurality of transistors and a resistance element to adjust the output impedance.

In the example presented in the fourth embodiment, the switching circuits 52 and 53 and the comparators 62 and 63 are used. For example, by using a selector that is capable of selecting one input from a plurality of inputs, the switching circuit and the comparator may be shared with a plurality of signals.

FIG. 30 is a block diagram showing a modified example of the ZQ calibration circuit 23, in which a selector 71 is used to share a switching circuit 54 and a comparator 64. As shown in FIG. 30, the ZQ calibration circuit 23 according to the modified example comprises the selector 71, the switching circuit 54, and the comparator 64 instead of the switching circuits 52 and 53, and the comparators 62 and 63.

The selector 71 connects a node N30 to a node N41, or a node N34 to the node N41 based on signal SEL2 received from the sequencer 27. That is, based on signal SEL2 received from the sequencer 27, signal ZQ_P or ZQ_N is transferred to the node N41.

Based on signal SEL received from the sequencer 27, the switching circuit 54 connects the node N41 to a node N43 or a node N44, and connects a node N42 to the node N44 or the node N43. The connecting method is the same as those of the switching circuits 52 and 53. That is, when signal SEL is, for example, an "L" level, the switching circuit 54 connects the node N41 to the node N43, and connects the node N42 to the node N44. On the other hand, when signal SEL is, for example, an "H" level, the switching circuit 54 connects the node N41 to the node N44, and connects the node N42 to the node N43. The reference voltage VREF is applied to the node N42. The reference voltage VREF is, for example, a voltage that is half the power supply voltage VDD.

The comparator 64 has a non-inverting input terminal connected to the node N43, and an inverting input terminal connected to the node N44. The comparator 64 compares the voltage of the node N43 and the voltage of the node N44, and outputs the comparison result from the output terminal to the sequencer 27 as signal FLG2.

Now, an operation regarding the ZQ calibration circuit 23 according to the modified example shown in FIG. 30 will be explained. In the example shown in FIG. 30, operations other than the operation regarding the selector 71 are the same as those in the fourth embodiment.

First of all, the sequencer 27 transmits signal SEL2 to the selector 71, and transfers signal ZQ_P to the node N41. Subsequently, operations corresponding to steps S100, S101, and S102 explained in FIG. 21 of the fourth embodiment are executed. That is, the sequencer 27 calculates and sets the third ZQcode_p by using the switching circuit 54, the comparator 64, and signal FLG2 of the modified example instead of the switching circuit 52, the comparator 62, and signal FLGP in the fourth embodiment.

Then, the sequencer 27 transmits signal SEL2 to the selector 71 and transfers signal ZQ_N to the node N41. Subsequently, operations corresponding to steps S103, S104, and S105 explained in FIG. 21 of the fourth embodiment are executed. That is, the sequencer 27 calculates and sets the third ZQcode_n by using the switching circuit 54, the comparator 64, and signal FLG2 of the modified example instead of the switching circuit 53, the comparator 63, and signal FLGN in the fourth embodiment.

In this manner, the ZQ calibration circuit 23 according to the modified example shown in FIG. 30 is able to share the switching circuit 54 and the comparator 64 with respect to a plurality of signals by selecting a signal by the selector 71. The modification of the fourth embodiment is not limited to this, and may share the switching circuit 54 and the comparator 64 by making also the other signals selectable by the selector 71.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
   a memory cell array configured to hold data;
   a first circuit configured to, when outputting data read from the memory cell array to an external device, receive a first signal and a second signal from the external device, control duty cycles of the first signal and the second signal based on a third signal, and output a fourth signal and a fifth signal to the external device;
   a second circuit configured to acquire information regarding duty cycles of the fourth signal and the fifth signal; and
   a third circuit configured to control the third signal based on the information acquired by the second circuit,
   wherein the second circuit includes:
      a switching circuit configured to transfer the fourth signal to a first node, and the fifth signal to a second node, or transfer the fourth signal to the second node, and the fifth signal to the first node based on a sixth signal; and a comparator configured to compare a signal voltage in the first node and a signal voltage in the second node, and output the comparison result to the third circuit as the information.

2. The semiconductor memory device according to claim 1, wherein the third circuit is configured to:
control the sixth signal to cause the switching circuit to transfer the fourth signal to the first node, and, further, transfer the fifth signal to the second node, and change the third signal, to hold the third signal as of a first time when the comparison result changes in the comparator as a first code;
control the sixth signal to cause the switching circuit to transfer the fourth signal to the second node, and, further, transfer the fifth signal to the first node, and change the third signal, to hold the third signal as of a second time when the comparison result changes in the comparator as a second code; and
generate a third code based on the first code and the second code, and replace the generated third code with the third signal to control duty cycles of the fourth signal and the fifth signal.

3. The semiconductor memory device according to claim 2, wherein:
the third signal is a signal of a plurality of bits,
the third circuit, when obtaining the first code:
initializes the bits of the third signal;
when the comparison result in the comparator is a first logic level in a state where the third signal is initialized, increments a bit count of the third signal, and searches for the third signal as of the first time when the comparison result changes; and
when the comparison result in the comparator is a second logic level that is different from the first logic level in a state where the third signal is initialized, decrements a bit count of the third signal, and searches for the third signal as of the first time when the comparison result changes.

4. The semiconductor memory device according to claim 3, wherein the third circuit, when obtaining the second code:
initializes the bits of the third signal;
when the comparison result in the comparator is the first logic level in a state where the third signal is initialized, decrements a bit count of the third signal, and searches for the third signal as of the second time when the comparison result changes; and
when the comparison result in the comparator is the second logic level in a state where the third signal is initialized, increments a bit count of the third signal, and searches for the third signal as of the second time when the comparison result changes.

5. The semiconductor memory device according to claim 1, wherein the first signal and the second signal are mutually complementary clock signals, and are transmitted to the external device that controls the semiconductor memory device.

6. The semiconductor memory device according to claim 5, wherein the fourth signal and the fifth signal are mutually complementary clock signals, and
wherein when data is transmitted from the memory cell array to the external device, the data is transmitted to the external device together with a seventh signal and an eighth signal that are based on the fourth signal and the fifth signal.

7. The semiconductor memory device according to claim 1, wherein:
the second circuit further includes a first low-pass filter and a second low-pass filter,
the fourth signal is input to the switching circuit after passing the first low-pass filter, and
the fifth signal is input to the switching circuit after passing the second low-pass filter.

8. A semiconductor memory device, comprising:
a memory cell array configured to hold data;
a first circuit configured to output data read from the memory cell array to an external device, receive a signal from the external device, and adjust an output impedance and a termination resistance;
a second circuit configured to adjust an output impedance;
a third circuit configured to acquire information for controlling the output impedance of the second circuit; and
a fourth circuit configured to control the output impedance or the termination resistance of the first circuit and the output impedance of the second circuit based on the information acquired by the third circuit,
wherein the second circuit includes:
a first pull-up circuit that pulls up a signal voltage of a first signal in a first node to which a resistance element is connected, and changes an output impedance based on a second signal;
a second pull-up circuit that pulls up a signal voltage of a third signal in a second node, and changes an output impedance based on a fourth signal; and
a pull-down circuit that pulls down a signal voltage of the third signal in the second node, and changes an output impedance based on a fifth signal, and
wherein the third circuit includes:
a first switching circuit configured to transfer the first signal to a third node, and a seventh signal to a fourth node, or transfer the first signal to the fourth node, and the seventh signal to the third node based on a sixth signal;
a first comparator configured to compare a signal voltage in the third node and a signal voltage in the fourth node, and output the comparison result to the fourth circuit;
a second switching circuit configured to transfer the third signal to a fifth node, and an eighth signal to a sixth node, or transfer the third signal to the sixth node, and the eighth signal to the fifth node based on the sixth signal; and
a second comparator configured to compare a signal voltage in the fifth node and a signal voltage in the sixth node, and output the comparison result to the fourth circuit.

9. The semiconductor memory device according to claim 8, wherein the fourth circuit is configured to:
acquire a first code based on the second signal as of a first time when the comparison result in the first comparator changes by changing the second signal;
acquire a second code based on the fifth signal as of a second time when the comparison result in the second comparator changes by changing the fifth signal; and
control the output impedance or the termination resistance of the first circuit and the output impedance of the second circuit based on the first code and the second code.

10. The semiconductor memory device according to claim 9, wherein the fourth circuit is configured to:
control the sixth signal to cause the first switching circuit to transfer the first signal to the third node, and, further, transfer the seventh signal to the fourth node, and change the second signal to hold the second signal as of the first time when the comparison result changes in the first comparator as a third code;

control the sixth signal to cause the first switching circuit to transfer the first signal to the fourth node, and, further, transfer the seventh signal to the third node, and change the second signal to hold the second signal as of a third time when the comparison result changes in the first comparator as a fourth code;

generate and hold the first code based on the third code and the fourth code, and replace the generated first code with the fourth signal to set the output impedance of the second pull-up circuit;

control the sixth signal to cause the second switching circuit to transfer the third signal to the fifth node, and, further, transfer the eighth signal to the sixth node, and change the fifth signal to hold the fifth signal as of the second time when the comparison result changes in the second comparator as a fifth code;

control the sixth signal to cause the second switching circuit to transfer the third signal to the sixth node, and, further, transfer the eighth signal to the fifth node, and change the fifth signal to hold the fifth signal as of a fourth time when the comparison result changes in the second comparator as a sixth code; and generate and hold the second code based on the fifth code and the sixth code.

11. The semiconductor memory device according to claim 9, wherein:

the first code and the second code are signals of a plurality of bits;

the first circuit includes a first transistor and a second transistor that control the output impedance or the termination resistance of the first circuit, a first resistance element connected to the first transistor, and a second resistance element connected to the second transistor;

the first pull-up circuit includes a third transistor and a fourth transistor that control the output impedance of the first pull-up circuit, a third resistance element connected to the third transistor, and a fourth resistance element connected to the fourth transistor;

the second pull-up circuit includes a fifth transistor and a sixth transistor that control the output impedance of the second pull-up circuit, a fifth resistance element connected to the fifth transistor, and a sixth resistance element connected to the sixth transistor;

the pull-down circuit includes a seventh transistor and an eighth transistor that control the output impedance of the pull-down circuit, a seventh resistance element connected to the seventh transistor, and an eighth resistance element connected to the eighth transistor; and the first transistor, the second transistor, the third transistor, the fourth transistor, the fifth transistor, the sixth transistor, the seventh transistor, and the eighth transistor are controlled by one of the second signal, the sixth signal, the seventh signal, the first code, and the second code.

12. The semiconductor memory device according to claim 11, wherein a current drivability of the first transistor is N times (N is a natural number) a current drivability of the second transistor, a resistance value of the first resistance element is 1/N times a resistance value of the second resistance element, a current drivability of the third transistor is M times (M is a natural number) a current drivability of the fourth transistor, a resistance value of the third resistance element is 1/M times a resistance value of the fourth resistance element, a current drivability of the fifth transistor is M times (M is a natural number) a current drivability of the sixth transistor, a resistance value of the fifth resistance element is 1/M times a resistance value of the sixth resistance element, a current drivability of the seventh transistor is M times (M is a natural number) a current drivability of the eighth transistor, and a resistance value of the seventh resistance element is 1/M times a resistance value of the eighth resistance element.

13. The semiconductor memory device according to claim 8, wherein the fourth circuit supplies the second signal to the second pull-up circuit as the sixth signal.

14. The semiconductor memory device according to claim 8, wherein the second pull-up circuit is a replica circuit of the first pull-up circuit.

15. A semiconductor memory device, comprising:

a memory cell array configured to hold data;

a first circuit configured to output data read from the memory cell array to an external device, receive a signal from the external device, and adjust an output impedance and a termination resistance;

a second circuit configured to adjust an output impedance;

a third circuit configured to acquire information for controlling the output impedance of the second circuit; and a fourth circuit configured to control the output impedance or the termination resistance of the first circuit and the output impedance of the second circuit based on the information acquired by the third circuit, wherein the second circuit includes:

a first pull-up circuit that pulls up a signal voltage of a first signal in a first node to which a resistance element is connected, and changes an output impedance based on a second signal;

a second pull-up circuit that pulls up a signal voltage of a third signal in a second node, and changes an output impedance based on a fourth signal; and a pull-down circuit that pulls down a signal voltage of the third signal in the second node, and changes an output impedance based on a fifth signal, and wherein the third circuit includes:

a selection circuit configured to transfer one of the first signal or the third signal to a third node based on a sixth signal;

a first switching circuit configured to transfer a signal of the third node to a fourth node, and an eighth signal to a fifth node, or transfer a signal of the third node to the fifth node, and the eighth signal to the fourth node based on a seventh signal; and a first comparator configured to compare a signal voltage in the fourth node and a signal voltage in the fifth node, and output the comparison result to the fourth circuit.

16. The semiconductor memory device according to claim 15, wherein the fourth circuit is configured to:

in a case where the selection circuit transfers the first signal to the third node, acquire a first code based on the second signal as of a first time when the comparison result in the first comparator changes by changing the second signal;

in a case where the selection circuit transfers the third signal to the third node, acquire a second code based on the fifth signal as of a second time when the comparison result in the first comparator changes by changing the fifth signal; and control the output impedance or the termination resistance of the first circuit and the output impedance of the second circuit based on the first code and the second code.

17. The semiconductor memory device according to claim 16, wherein:
the first code and the second code are signals of a plurality of bits;
the first circuit includes a first transistor and a second transistor that control the output impedance or the termination resistance of the first circuit, a first resistance element connected to the first transistor, and a second resistance element connected to the second transistor;
the first pull-up circuit includes a third transistor and a fourth transistor that control the output impedance of the first pull-up circuit, a third resistance element connected to the third transistor, and a fourth resistance element connected to the fourth transistor;
the second pull-up circuit includes a fifth transistor and a sixth transistor that control the output impedance of the second pull-up circuit, a fifth resistance element connected to the fifth transistor, and a sixth resistance element connected to the sixth transistor;
the pull-down circuit includes a seventh transistor and an eighth transistor that control the output impedance of the pull-down circuit, a seventh resistance element connected to the seventh transistor, and an eighth resistance element connected to the eighth transistor; and
the first transistor, the second transistor, the third transistor, the fourth transistor, the fifth transistor, the sixth transistor, the seventh transistor, and the eighth transistor are controlled by one of the second signal, the sixth signal, the seventh signal, the first code, and the second code.

18. The semiconductor memory device according to claim 17, wherein a current drivability of the first transistor is N times (N is a natural number) a current drivability of the second transistor, a resistance value of the first resistance element is 1/N times a resistance value of the second resistance element, a current drivability of the third transistor is M times (M is a natural number) a current drivability of the fourth transistor, a resistance value of the third resistance element is 1/M times a resistance value of the fourth resistance element, a current drivability of the fifth transistor is M times (M is a natural number) a current drivability of the sixth transistor, a resistance value of the fifth resistance element is 1/M times a resistance value of the sixth resistance element, a current drivability of the seventh transistor is M times (M is a natural number) a current drivability of the eighth transistor, and a resistance value of the seventh resistance element is 1/M times a resistance value of the eighth resistance element.

19. The semiconductor memory device according to claim 15, wherein the fourth circuit supplies the second signal to the second pull-up circuit as the sixth signal.

20. The semiconductor memory device according to claim 15, wherein the second pull-up circuit is a replica circuit of the first pull-up circuit.

* * * * *